(12) United States Patent
Lewinski et al.

(10) Patent No.: US 7,973,535 B2
(45) Date of Patent: Jul. 5, 2011

(54) METHODS AND APPARATUS TO MANAGE GROUND FAULT CONDITIONS WITH A SINGLE COIL

(75) Inventors: Artur J. Lewinski, Dallas, TX (US);
Ross Teggatz, McKinney, TX (US);
Thomas E. Cosby, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/908,684

(22) Filed: Oct. 20, 2010

(65) Prior Publication Data
US 2011/0032646 A1 Feb. 10, 2011

Related U.S. Application Data

(62) Division of application No. 11/923,365, filed on Oct. 24, 2007, now Pat. No. 7,834,636.

(60) Provisional application No. 60/864,068, filed on Nov. 2, 2006, provisional application No. 60/864,056, filed on Nov. 2, 2006, provisional application No. 60/864,058, filed on Nov. 2, 2006.

(51) Int. Cl.
*G01R 31/02* (2006.01)
(52) U.S. Cl. ........................... 324/509; 324/522
(58) Field of Classification Search .................. 324/509, 324/522, 616; 361/42, 46, 48
See application file for complete search history.

(56) References Cited

U.S. PATENT DOCUMENTS

| | | | |
|---|---|---|---|
| 3,400,335 A | 9/1968 | Orchard et al. | |
| 3,700,967 A * | 10/1972 | Hoss | 361/46 |
| 3,973,171 A | 8/1976 | Howell | |
| 4,333,157 A | 6/1982 | Lee | |
| 4,368,498 A * | 1/1983 | Neuhouser | 361/48 |
| 4,688,133 A | 8/1987 | Freeman | |
| 5,327,027 A | 7/1994 | Taylor | |
| 5,382,918 A | 1/1995 | Yamatake | |
| 5,420,740 A | 5/1995 | MacKenzie et al. | |
| 6,088,205 A | 7/2000 | Neiger et al. | |
| 6,532,139 B2 | 3/2003 | Kim et al. | |
| 6,751,528 B1 | 6/2004 | Dougherty | |
| 2004/0100742 A1 * | 5/2004 | Brown et al. | 361/42 |
| 2005/0212522 A1 | 9/2005 | Finlay, Sr. et al. | |
| 2005/0243485 A1 | 11/2005 | Gershen et al. | |
| 2006/0258321 A1 | 11/2006 | Shimada et al. | |

OTHER PUBLICATIONS

Wikipedia, "Gyrator," URL, http://en.wikipedia.org/wiki/Gyrator, Internet, Jan. 24, 2004, 2 pages.
Wikipedia, "Transconductance," URL, http://en.wikipedia.org/wiki/Transconductance, Internet, May 5, 2004, 3 pages.
Wikipedia, "Negative Resistance," URL, http://en.wikipedia.org/wiki/Negative_resistance, Internet, May 31, 2003, 12 pages.

(Continued)

*Primary Examiner* — Vincent Q Nguyen
(74) *Attorney, Agent, or Firm* — William B. Kempler; Wade J. Brady, III; Frederick J. Telecky, Jr.

(57) ABSTRACT

A ground fault detection device includes a sense coil including a primary winding and a secondary winding to detect current in a line conductor and a neutral conductor. It also includes a capacitor in parallel with the secondary winding and a virtual inductor to form a resonance circuit having a signal proportional to the current and being indicative of a ground fault condition.

14 Claims, 14 Drawing Sheets

OTHER PUBLICATIONS

National Semiconductor Corporation, "LM13700 Dual Operational Transconductance Amplifiers with Linearizing Diodes and Buffers," Jun. 2004, 25 pages.

Wikipedia. "Lm13700," URL, http://en.wikipedia.org/wiki/Lm13700, Internet. Jun. 14, 2006, 1 page.

Sam Goldwasser, "G.F.C.I," URL, http://www.codecheok.com/gfci_principal.htm., Internet, copyright 1998, 6 pages.

Nema Ground Fault Personnel Protection Section, "Understanding GFCIs," URL http://ts.nist.gov/standards/Global/upload/gannon.ppt, Internet, Mar. 1999, 42 pages.

Globalspec, "About Current-to-Voltage Converters," URL, http://data-acquisition.globalspec.com/LearnMore/Electrical_Electronic_Components/Wires_Cables/Current_to_Voltage.Connectors, Internet, Copyright 1999, 3 pages.

Fairchild Semi, "RV4141A Low Power Low Ground Fault Interrupter." URL, http://fairchildsemi.com, Internet, Jun. 30, 2005, 7 pages.

Unisonic Technologies Co., LTD, "UTCLM1851 Linear Integrated Circuit," date unknown, 9 pages.

National Semiconductor,"LM1851 Ground Fautt Interrupter," Jun. 1992, 8 pages.

Underwriters Laboratories Inc., "Do GFCIs Carry a HP Rating and a Switch Rating?" Oct. 2001, 2 pages.

"Gyrator-Based Biquad Filters and Negative Impedance Converters for Microwaves," 1998, John Wiley & Sons, Inc., CCC 1098-4290r98r020086-16, pp. 86-101 (Stephen E. Sussman-Fort).

"Integrated Variable Capacitors for Large Capacitance Variations," IEEE Proceedings, November, pp. 1570 (T.N. Rao, W. New, 8.0. Anderson, R.W. Newcomb).

* cited by examiner

METHODS AND APPARATUS TO MANAGE GROUND FAULT CONDITIONS WITH A SINGLE COIL

RELATED APPLICATIONS

This application is a divisional of U.S. Nonprovisional patent application Ser. No. 11/923,365, filed Oct. 24, 2007, which claims the benefit of U.S. Provisional Application Ser. No. 60/864,068 filed Nov. 2, 2006, U.S. Provisional Application Ser. No. 60/864,056 filed Nov. 2, 2006, and U.S. Provisional Application Ser. No. 60/864,058 filed Nov. 2, 2006, all of which are hereby incorporated by reference in their entireties.

FIELD OF THE DISCLOSURE

This disclosure relates generally to ground fault interruption and, more particularly, to methods and apparatus to manage ground fault conditions with a single coil.

BACKGROUND

Electrical power distribution typically includes multiple-conductor wires to transmit electrical energy and facilitate a ground path for safety. A shock hazard exists in the event of an unintended path from the conductor wires or surfaces (such as a chassis of electrical equipment), which carry electric current, and the ground path. The conductors, such as a line conductor (also referred to as "hot") and a neutral, or common, conductor, may leak electrical current to each other, to ground, and/or to a person or object as an intermediate path to ground. As such, a person in the intermediate path may receive a lethal electrical shock.

Ground fault circuit interrupters (GFCIs) may minimize and/or eliminate the risk of electrical shock by monitoring an imbalance of electrical current between the hot and neutral lines. Generally speaking, a line-to-ground fault may be detected by way of a coil (e.g., a toroidal Hall-effect coil) around the line and neutral conductors that provide electrical energy to a load. Under non-fault operating conditions, the magnetic fields that result from current in the hot conductor cancel with the magnetic fields that result from an opposite current flow in the neutral conductor, thereby failing to induce a corresponding electrical current in the coil. However, if current from the line conductor leaks current to ground, then the neutral conductor current, and its corresponding magnetic field, will be less than the magnetic field of the line conductor, thereby affecting the coil to produce a corresponding electrical signal indicating a fault. The electrical coil signal, such as a current value, may be compared to a threshold which, when exceeded, causes the GFCI to force a mechanical break to the load via, for example, a circuit interrupter. The circuit interrupter may be employed as a double pole, single throw switch that, when activated, physically separates the line and the neutral conductors from the load.

Detecting a neutral-to-ground fault poses additional challenges because, in part, the neutral conductor is also grounded at the source. Such double grounding of the neutral conductor could create a situation where a portion of the fault current from the line conductor returns to the source through the neutral conductor. As a consequence, the traditional single coil approach will not detect a flux imbalance representative of the actual current leakage magnitude. To aid in neutral-to-ground fault detection, a second coil is typically employed that, when coupled to the first coil, produces a positive feedback loop. Despite the lower detected current imbalances observed during a neutral-to-ground fault, which may not exceed a tripping threshold, the coupled coils will develop an oscillation that, when detected, may be used to indicate a circuit trip or interruption is warranted. Additionally or alternatively, a signal may be injected on the second coil so that, in the event of a neutral to ground fault, the injected signal is induced in the neutral line and is detected by the first coil.

DETAILED DESCRIPTION

Figure 1:
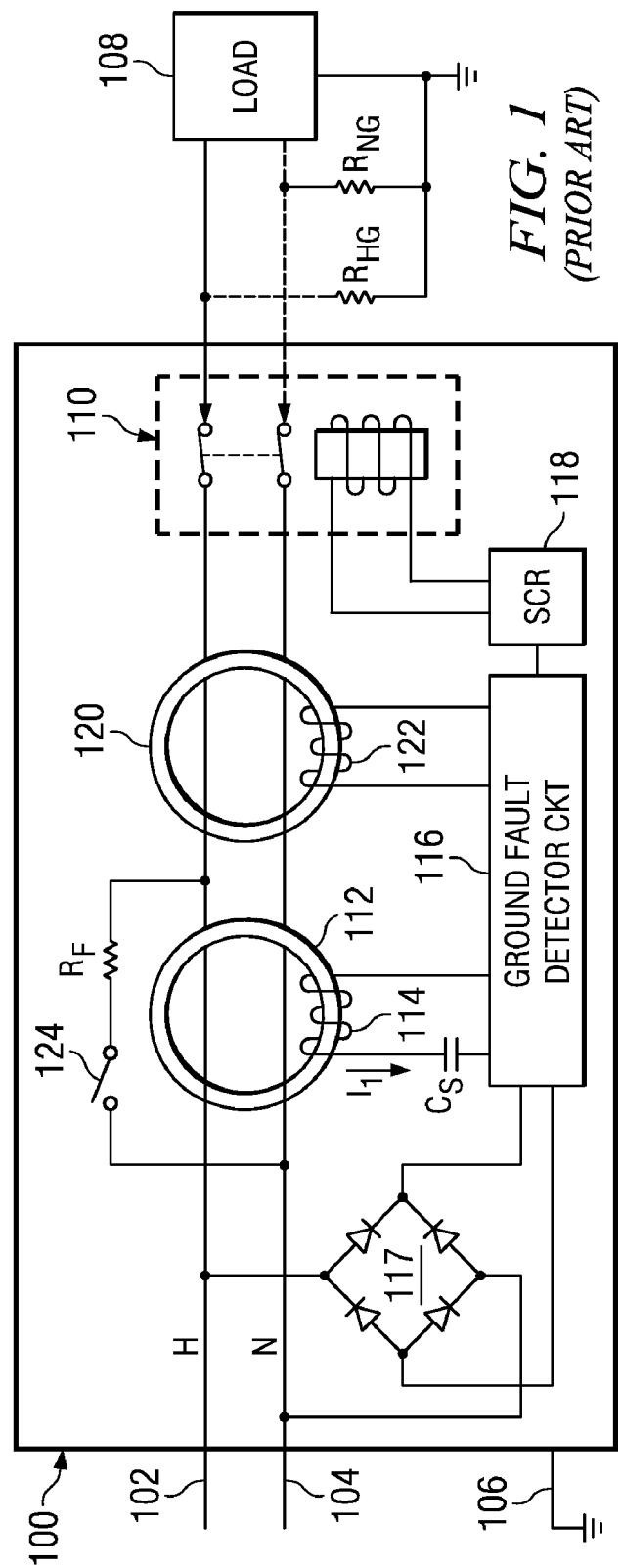
FIG. 1 is a block diagram of a prior art ground fault circuit interrupter.

FIG. 1 is a block diagram of a prior art ground fault circuit interrupter (GFCI) 100. The GFCI 100 electrically connects to a line (or "hot") conductor 102, a neutral conductor 104, and in some instances, a ground conductor 106. During normal operating conditions, the GFCI 100 provides electrical power via the line conductor 102 and neutral conductor 104 to an electrical load 108. However, a solenoid relay contact 110 may break electrical contact with the load 108 if a fault should occur. For example, faults having a resistive value may occur between the line conductor 102 to ground 106 ($R_{LG}$) or from the neutral conductor 104 to ground 106 ($R_{NG}$).

As shown in FIG. 1, a first sense coil 112 monitors for a current imbalance between the line conductor 102 and the neutral conductor 104 that may occur when a fault condition between these two conductors is present. For example, if no fault condition is present, then all such current carried by the line conductor 102 is also carried by the neutral conductor 104, but in the opposite direction. When a fault occurs, some of the current provided by the line conductor 102 takes an alternate path that bypasses the first sense coil 112, thereby causing n current ($I_1$) induced to a secondary winding 114 of the first sense coil 112. Generally speaking, the sense coil may be employed as a toroidal coil constructed with high permeability laminated steel rings. A primary of the sense coil may be a single turn, through which the line and neutral conductors pass, while a secondary winding of the sense coil may include, for example, approximately 200 to 1500 turns. Current values detected by the first coil 112 are received by a ground fault detector circuit 116 powered by a bridge circuit 117, and such received signals are compared against a threshold, which is typically established in view of regulatory standards (e.g., Underwriters Laboratories). The established threshold(s) may pertain to a maximum current threshold (e.g., trip if the detected current exceeds a root mean square value of 6 milliamps) and/or a maximum duration of observed current imbalance (e.g., trip if detected current is sustained for more than three line-cycles). The ground fault detector circuit 116 responds to an exceeded threshold by sending one or more signals to a switching device 118, such as a silicon controlled rectifier (SCR), which may drive the solenoid relay contacts 110 to break the electrical contact with the load 108.

In the event of a neutral to ground fault, the first sense coil 112 may not sense any current imbalance, thus fail to trip the solenoid relay contact(s) 110. To detect a neutral to ground fault ($R_{NG}$), a second coil 120 is employed having a secondary coil winding 122 to which the ground fault detector circuit 116 applies an oscillation signal. During non-fault operating conditions, the signal is not induced into the conductors because there is no impedance imbalance between the line conductor 102 and the neutral conductor 104 (no path between neutral and ground). However, in the event of a ground to neutral fault, the applied oscillation signal from the second coil 120 will propagate to the neutral-to-ground path and is then sensed by the first sense coil 112. When the corresponding oscillation signal is detected by the first sense coil 112, and processed by the ground fault detector circuit 116, the switching device may cause the relay contact 110 to break electrical contact.

The GFCI 100 also includes a test switch 124 and fault resistor $R_F$ to allow an end user (e.g., a homeowner) to verify that the GFCI 100 is working properly. When the test switch 124 is activated, current from the line conductor 102 passes through the first sense coil 112 in a first direction, but is diverted through $R_F$ and the test switch 124 to the neutral conductor 104. As a result, the returning current (in a second/opposite direction) on the neutral conductor 104 as it passes through the first sense coil 112 is less than the current on the line conductor 102 when it passes through the first sense coil 112, which causes a detected current imbalance between the line conductor 102 and the neutral conductor 104. However, a manual test process with the test switch 124 may not be a regular practice of the end user, which may mean that the end user is not protected in the event of a fault that may have occurred in between manual tests, if any.

The GFCI 100 also includes a saturation capacitor ($C_S$) for the first sense coil 112 and the second coil 120 to, in part, prevent and/or minimize saturation of one or more voltage-to-current amplifiers that are connected to the coils. For example, an amplifier and/or a voltage-to-current amplifier/converter typically has a very low input impedance when configured with negative feedback. The secondary sense coil winding 114 behaves as an inductor and operates similar to a short circuit at low frequencies. Such operation creates a very high gain configuration, thus small direct current (DC) offsets that are typically present in operational amplifiers (OPAMPS) and/or similar devices may saturate the output. The output saturation may be eliminated with $C_S$, which operates as a DC block yet allows AC signals to pass therethrough. Capacitors must typically have relatively large values to both block DC and pass household line frequency signals (e.g., 50 Hz, 60 Hz), which correspond to added manufacturing costs for the GFCI 100. Additionally, added cost results from having multiple coils within the GFCI 100.

The various methods and apparatus described herein may facilitate ground fault detection without a second coil, thereby eliminating an additional potential point of failure and enabling a cost savings opportunity that may be passed on to end users. Furthermore, the methods and apparatus described herein may facilitate sense coil operation with a smaller capacitor, thereby saving additional costs related to manufacture of the ground fault detection device. While self test techniques may still be performed by the end user, the apparatus and methods described herein may facilitate automatic self testing on a periodic and/or continuous basis to allow identification of unsafe conditions before an end user is exposed to potential danger due to, for example, failure of one or more parts of a ground fault detection device to operate correctly. Some or all of the methods and apparatus described above may be used with one another.

Coil Elimination

Figure 2:
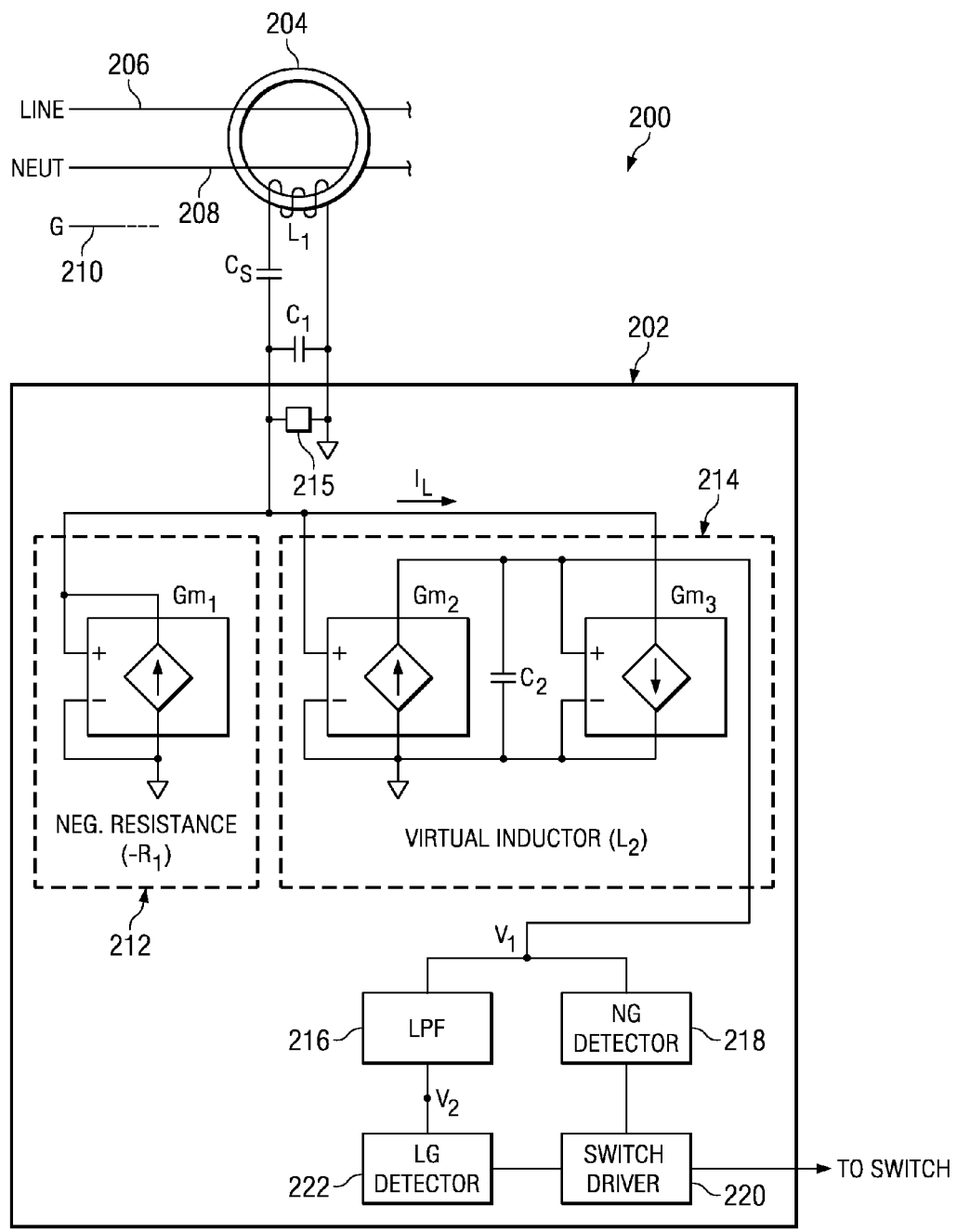
FIG. 2 is a block diagram of an example ground fault detector in which ground faults may be detected with a virtual inductor and a single sense coil.

Turning to FIG. 2, a portion of a ground fault detector device 200 is shown having a ground fault detector circuit 202. The example ground fault detector circuit 202 (GFDC) may operate instead of, for example, the ground fault detector circuit 116 and corresponding second coil 120 of FIG. 1. The ground fault detector circuit 202 receives signals from a sense coil 204 having a primary winding through which a line conductor 206 and a neutral conductor 208 pass. As described in further detail below, the sense coil 204 allows the GFDC 202 to detect a current imbalance between the line conductor 206 and the neutral conductor 208 during fault conditions. Moreover, the GFDC 202 may detect a fault between the line conductor 206 and a ground 210, and/or the neutral conductor 208 and the ground 210.

The sense coil 204 includes a secondary winding ($L_1$), which is connected in parallel with a capacitor ($C_1$) and an active inductor ($L_2$) that is simulated by voltage to current converters $G_{M2}$, $G_{M3}$, and a capacitor $C_2$. Persons having ordinary skill in the art will appreciate that the voltage to current converters $G_{M2}$, $G_{M3}$, and the capacitor $C_2$ may be referred to as a virtual inductor 214. The value of $L_2$ is designed to be much smaller than $L_1$, thus the overall inductance value of the parallel combination of $L_2$ and $L_1$ has a value of, for all practical purposes, $L_2$. The parallel combination of the inductors ($L_1$ and $L_2$) and $C_1$ form a resonance circuit, such as an LC tank that is also in parallel with a negative resistance (formed by transconductance $G_{M1}$ in positive feedback) 212, which operates as a driving source to generate oscillations. The amplitude of oscillations may be limited with a limiter 215, as shown in FIG. 2. The limiter 215 may include, but is not limited to, a pair of diodes, zener diodes, etc. In the illustrated GFDC of FIG. 2, the virtual inductor $L_2$ 214 may perform a dual role that a traditional inductor may not facilitate. In particular, the virtual inductor $L_2$ 214 allows oscillations by virtue of the LC tank and, unlike a traditional inductor, also allows the measurement of the current going through. Since L2 is much smaller than L1, almost the totality of the current induced into the secondary winding 114 caused by a neutral to ground fault, can be measured.

A saturation capacitor $C_S$ is shown in series with $L_1$ to minimize and/or eliminate amplifier saturation during DC conditions. However, $C_S$ may be reduced as a cost savings initiative while preserving saturation prevention, as described in further detail below. Persons having ordinary skill in the art will appreciate that voltage-to-current converters may be rated by a transconductance value $g_M$. The transconductance is a ratio of the output current and an input voltage. Additionally, negative resistors may be implemented by, for example, one or more voltage-to-current amplifiers. A low pass filter 216 and neutral-to-ground (NG) detector 218 are connected to the output of the virtual inductor 214, and a switch driver 220 is connected to the NG detector 218 and a line-to-ground (LG) detector 222, discussed in further detail below. The example switch driver 220 may include a gate driver control for solid state switching devices such as, for example, bipolar junction transistors (BJTs), metal oxide field effect transistors (MOSFETs), silicon controlled rectifiers (SCRs), etc.

Figure 3A:
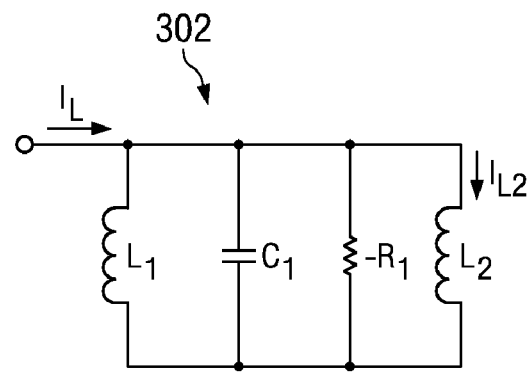
FIGS. 3A and 3B are an equivalent circuit diagram and a corresponding output plot for the example ground fault detector device of FIG. 2 during non-fault conditions.

If no fault condition is present (i.e., an NG and/or an LG fault), then $L_1$, $C_1$, $-R_1$ (or $G_{M1}$), and the virtual inductor 216 operate as a non-fault equivalent circuit 302 shown in FIG. 3A. In the illustrated non-fault equivalent circuit 302 of FIG. 3A, the voltage at node $V_1$ is proportional to the current $I_L$ passing through the virtual inductor $L_2$. Voltage $V_1$ may be represented as shown below in Equation 1.

$$V_1 = \frac{I_L}{G_{M3}} \qquad \text{(Equation 1)}$$

The equivalent circuit of FIG. 3A behaves as an oscillator to produce an oscillating current $I_L$, having a resonance frequency (f) as represented by Equation 2. The resonance frequency may be detected by the NG detector 218.

$$f = \frac{1}{2\pi L_2 C} \qquad \text{(Equation 2)}$$

Figure 3B:
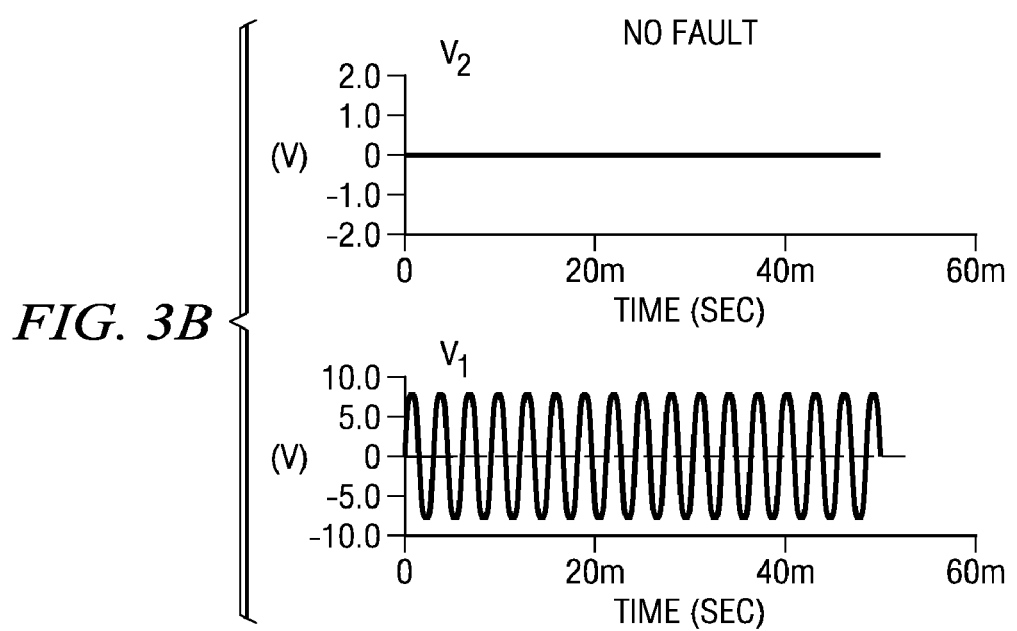

The NG detector 218 may be implemented in one or more ways including, but not limited to, a full wave rectifier connected to a comparator, a digital filter, etc. However, the resonance frequency component at node $V_1$ is blocked by the low pass filter 216 so that, under non-fault conditions, node $V_1$ includes a resonance frequency component while node $V_2$ does not include the resonance frequency component, as shown in FIG. 3B. The LG detector 222 may be employed to confirm that no faults exist by, for example, verifying the magnitude of signal at node $V_2$ is small enough.

Figure 4A:
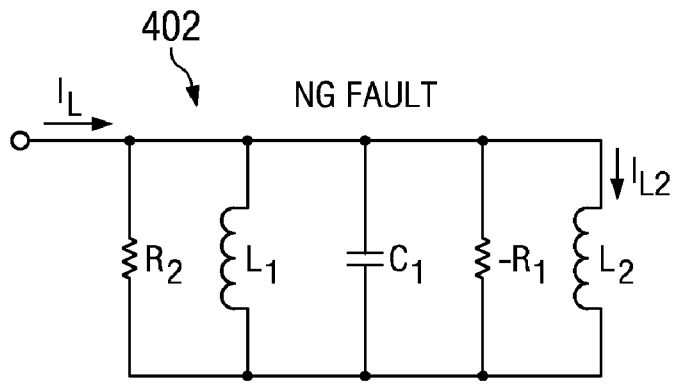
FIGS. 4A and 4B are an equivalent circuit diagram and a corresponding output plot for the example ground fault detector device of FIG. 2 during a neutral-to-ground fault.

If a neutral-to-ground (NG) fault is present, then the example GFDC 202 may be electrically represented by a neutral-to-ground (NG) equivalent circuit 402 shown in FIG. 4A. In the illustrated NG equivalent circuit 402 of FIG. 4A, resistor $R_2$ represents the NG resistance, which disrupts the oscillation previously established by the combination of $L_1$, $C_1$, $-R_1$, and $L_2$. The value of $R_2$ is shown below in Equation 3.

$$R_2 = n^2 * R_G \qquad \text{(Equation 3)}$$

Figure 4B:
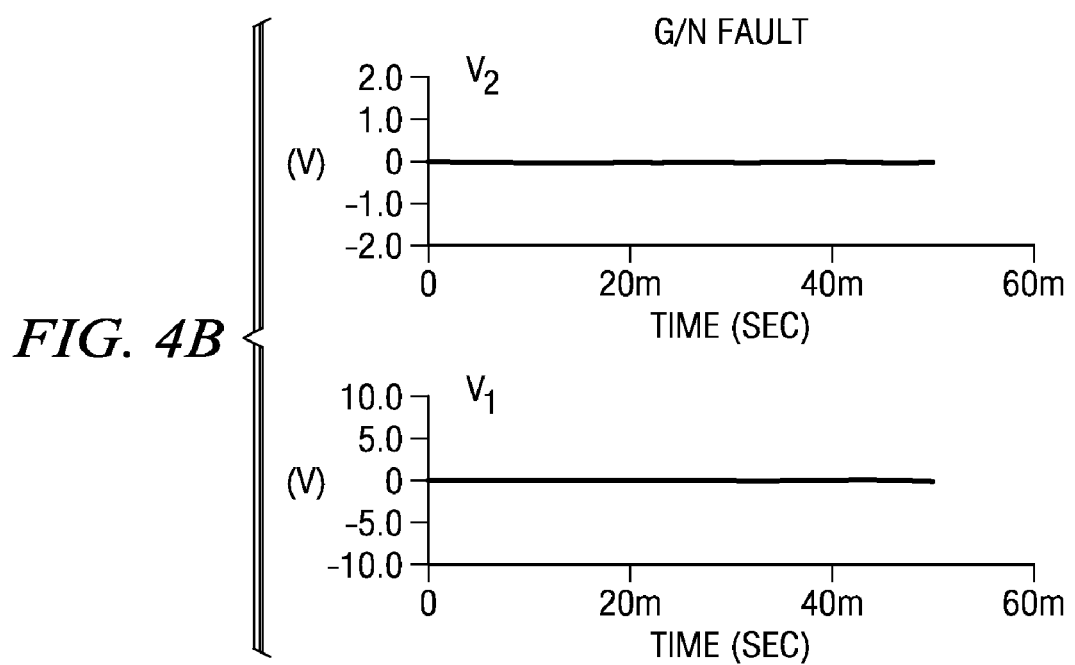

In the example Equation 3, n is the number of turns of the coil $L_1$, and $R_G$ is the NG resistance. When $R_2$ is less than the negative resistance $R_1$, the overall resistive value becomes positive and there is no longer a condition for oscillation and the resonance frequency component is lost. As a result, the NG detector 218 will not detect oscillations at node $V_1$, as shown in FIG. 4B, and, therefore, will trigger the switch driver 220.

Figure 5A:
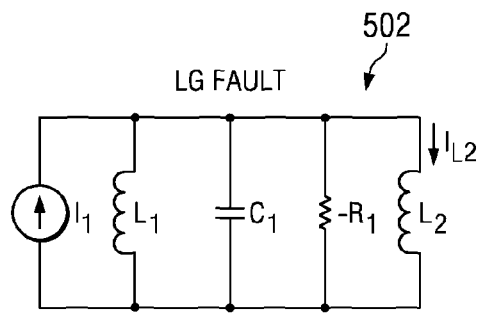
FIGS. 5A and 5B are an equivalent circuit diagram and a corresponding output plot for the example ground fault detector device of FIG. 2 during a line-to-ground fault.
Figure 5B:
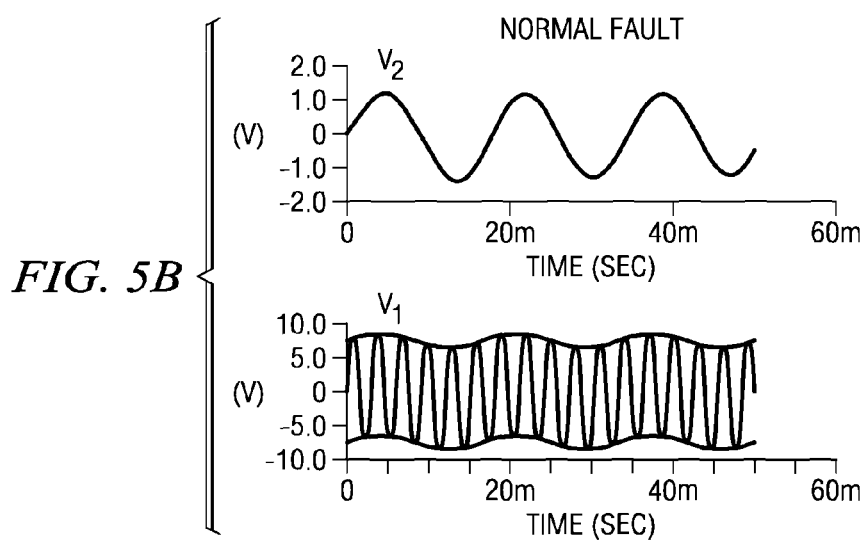

If a line-to-ground fault (LG) is present, then the example GFDC 202 may be electrically represented by an LG equivalent circuit 502 as shown in FIG. 5A. In the illustrated LG equivalent circuit 502, current $I_1$ represents a line current fault (which is a function of the imbalance current divided by the number of turns n) directly to ground at a source frequency (e.g., a U.S. domestic frequency of 60 Hertz (Hz)). During such an LG fault, node $V_1$ may still exhibit a signal component at resonance frequency by virtue of the LC tank (i.e., $L_2$ and $C_1$) driven by the negative resistance ($-R_1$). As such, detection of the properties of the signal at the NG detector 218 may not be sufficient to ascertain that a fault has occurred. However, the low pass filter 216 may segregate the relatively higher frequency component leaving lower frequency components (e.g., 60 Hz) at node $V_2$, as shown in FIG. 5B. The magnitude of the signal at line frequency (e.g., 60 Hz), detected by the LG detector 222 may cause the LG detector 222 to signal the switch driver 220, thereby allowing the example GFDC 202 to protect an end-user from a potential shock hazard. Additionally or alternatively, the switch driver may provide a fault indication to a user by driving an indicator lamp, a light-emitting diode (LED), and/or other indicia of a fault condition.

Figure 6:
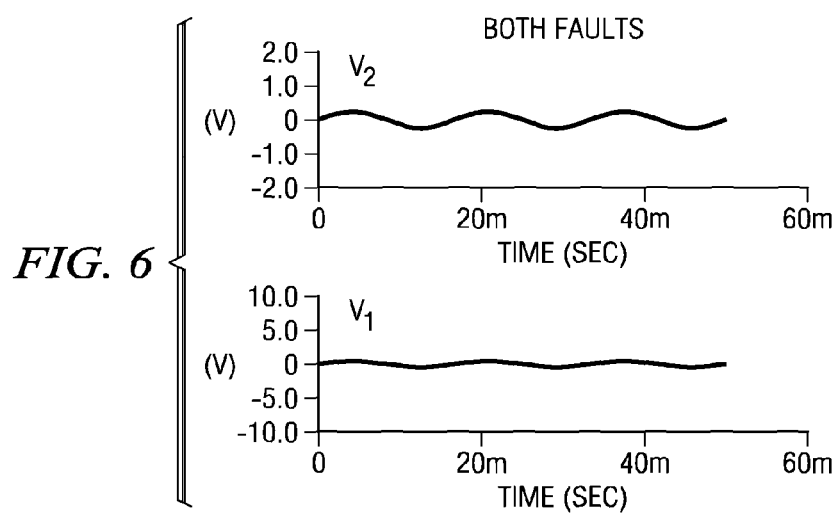
FIG. 6 is an example output plot for the example ground fault detector device of FIG. 2 during both a neutral-to-ground fault and a line-to-ground fault.

If both an NG fault and an LG fault are simultaneously present, the example GFDC 202 may detect such a condition and signal the switch driver 220, when appropriate. In the illustrated example node output of FIG. 6, the NG detector 218 detects an NG fault by virtue of the signal component at resonance frequency being absent at node $V_1$. Additionally, the LG detector 222 detects an LG fault by virtue of the properties of the signal at node $V_2$ (e.g., an amplitude, a duration, etc.)

Figure 7:
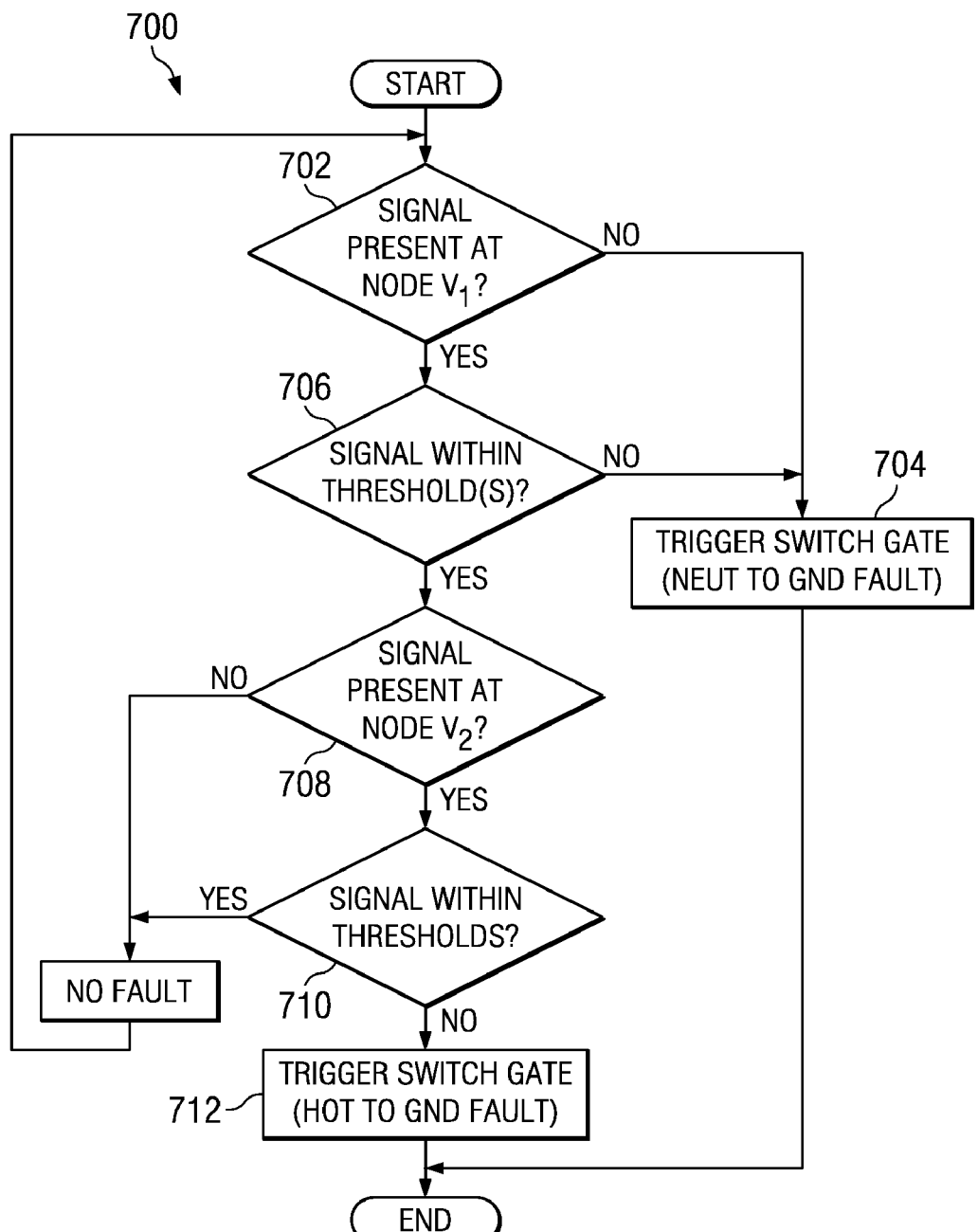
FIG. 7 is a flowchart representative of an example process to implement fault detection in the example ground fault detector device of FIG. 2.

FIG. 7 illustrates a flowchart representative of an example process that may be executed to implement the example GFDC 202 illustrated in FIG. 2. The example process of FIG. 7, as well as the example processes of FIGS. 12 and 15 discussed in further detail below, may be implemented using machine readable instructions executed by a processor, a controller, and/or any other suitable processing device. For example, the example processes of FIGS. 7, 12, and 15 may be embodied in coded instructions stored on a tangible medium such as a flash memory, or RAM associated with a processor (e.g., a controller, a microprocessor, a DSP). Alternatively, some or all of the example processes shown in the flowcharts of FIGS. 7, 12, and 15 may be implemented using an application specific integrated circuit (ASIC), a programmable logic device (PLD), a field programmable logic device (FPLD), discrete logic, hardware, firmware, etc. Also, some or all of the example processes of FIGS. 7, 12, and 15 may be implemented manually or as combinations of any of the foregoing techniques, for example, a combination of firmware and/or software and hardware may be implemented using circuits based on passive or active circuit components such as resistors, capacitors, inductors, operational amplifiers, etc.

Figure 12:
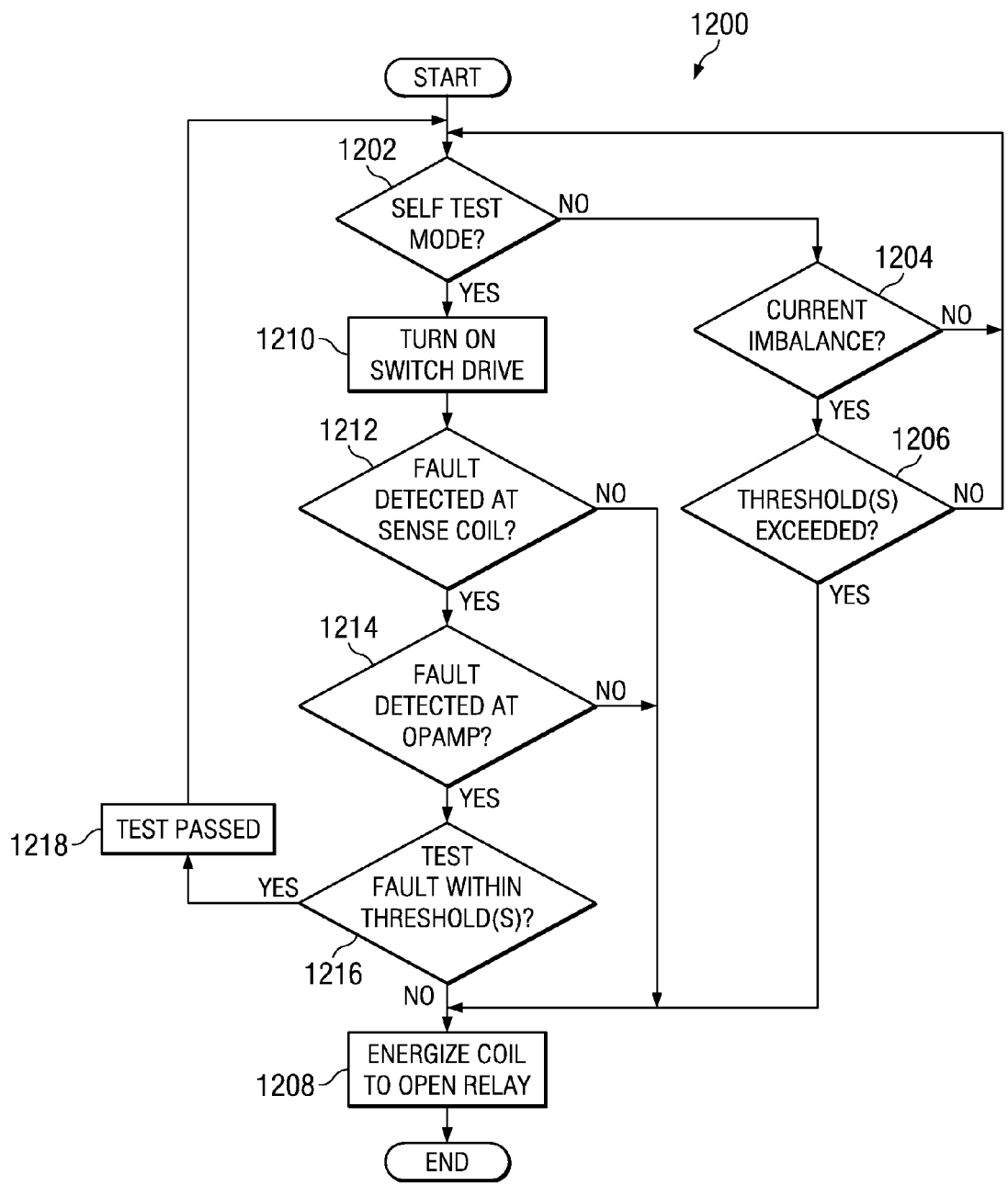
FIG. 12 is a flowchart representative of an example process to implement a self-test of the example ground fault detector device of FIG. 10.
Figure 14A:
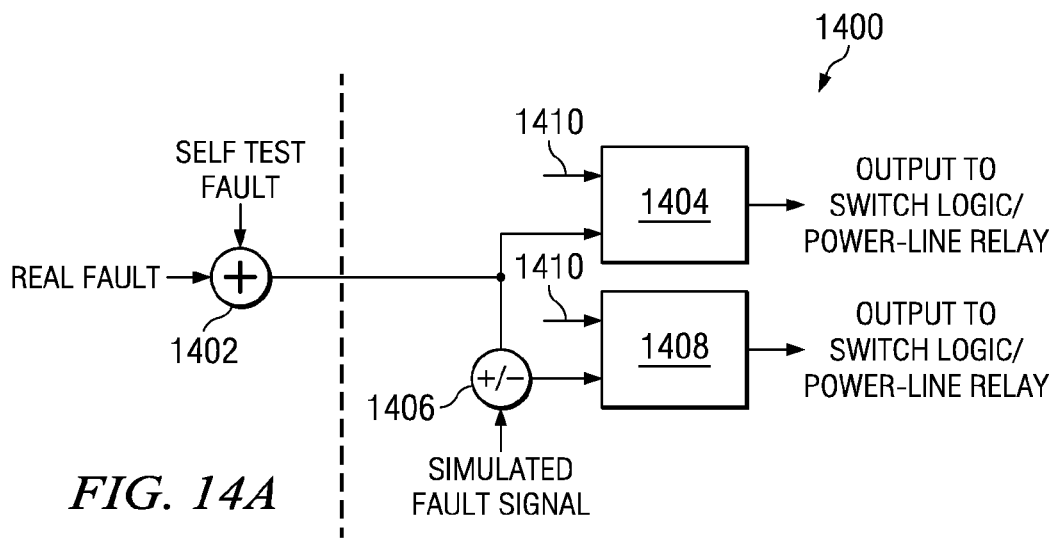
FIGS. 14A and 14B are block diagrams of example fault separation circuits to facilitate substantially continuous self-test in the example ground fault detector device of FIG. 13.
Figure 14B:
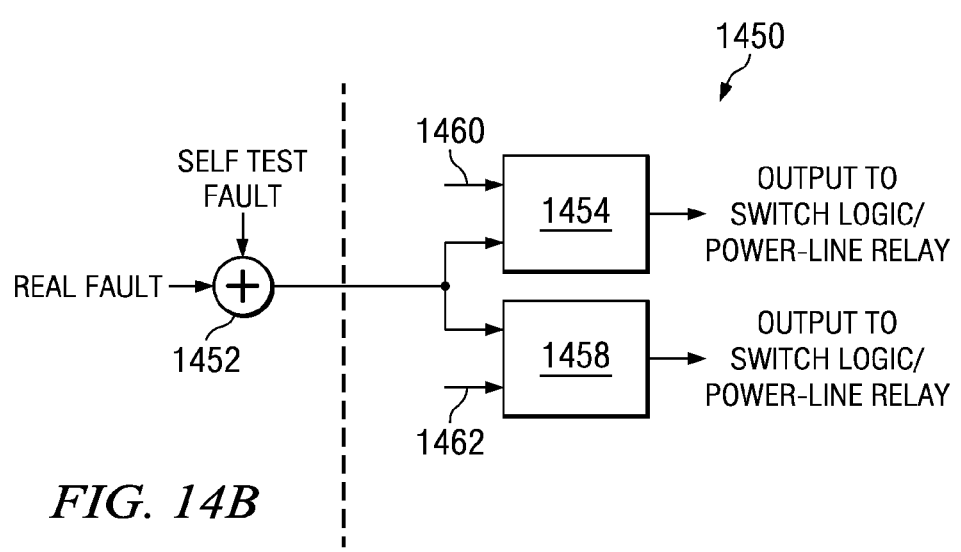
Figure 15:
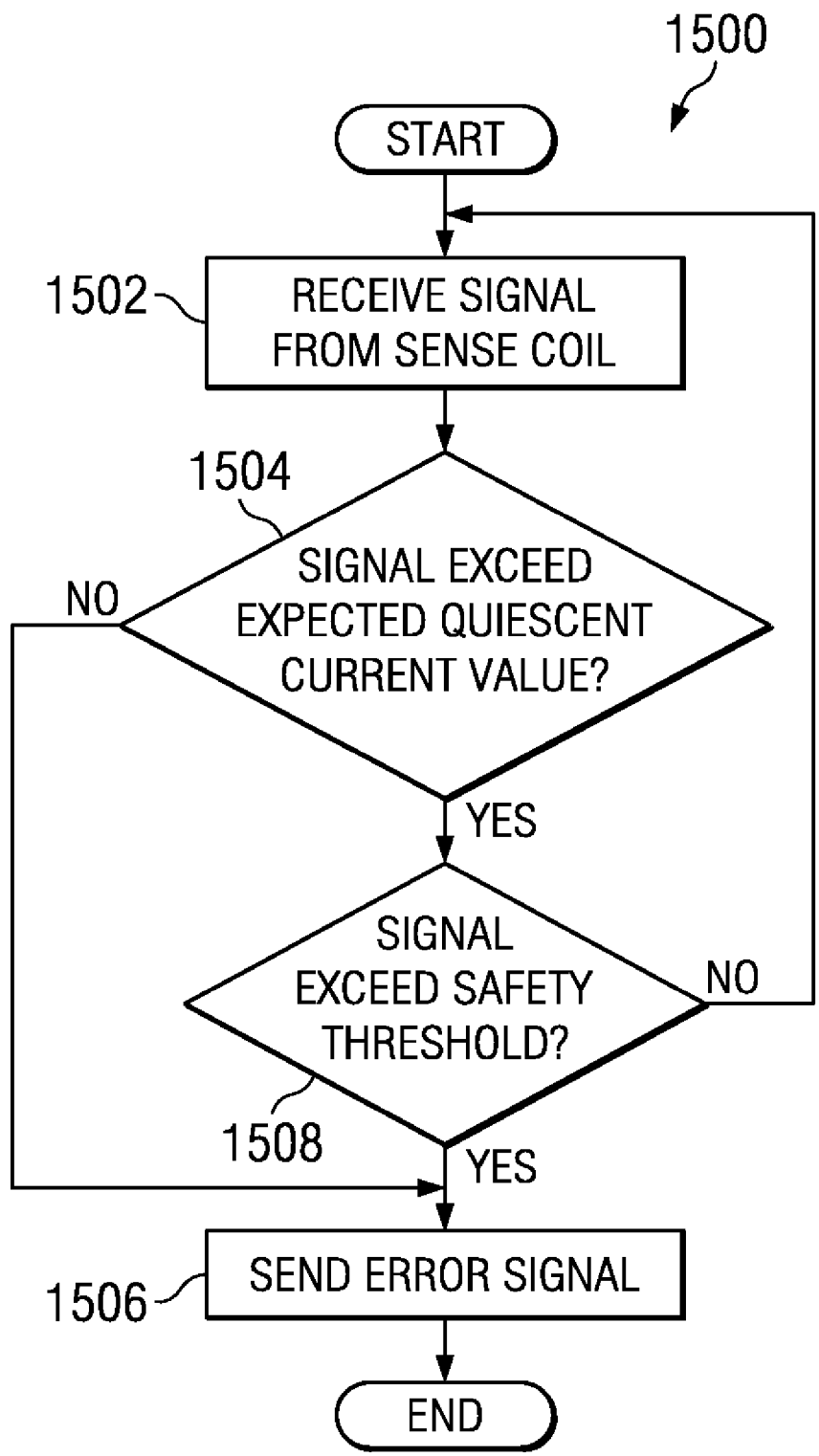
FIG. 15 is a flowchart representative of an example process to implement substantially continuous self-testing of the example ground fault detector device of FIG. 13.

Further, although the example processes of FIGS. 7, 12, and 15 are described with reference to the flowcharts of FIGS. 7, 12, and 15, persons having ordinary skill in the art will readily appreciate that many other methods of implementing the example GFDC 202, the example GFDC 802, the example GFDC 902, the example ground fault interrupter 1000, the example GFDC 1300, and/or the example circuits 1400 and 1450, respectively, illustrated in FIGS. 2, 8A, 9, 10, 13, 14A and 14B may be employed. For example, the order of execution of the blocks may be changed, and/or some of the blocks described may be changed, eliminated, sub-divided, or combined. Additionally, persons of ordinary skill in the art will appreciate that the example processes of FIGS. 7, 12, and 15 be carried out sequentially and/or carried out in parallel by, for example, separate processing threads, processors, devices, circuits, etc.

The example process 700 of FIG. 7 begins with, for example, the NG detector 218 monitoring node $V_1$ for the presence of a signal (block 702). If the NG detector 218 does not detect a signal at the resonance frequency, the example LG detector 222 may determine whether the output signal from the low pass filter 216 is within appropriate thresholds (block 710). The example NG detector 218 may then trigger the gate driver 220 as a condition indicative of an NG fault (block 704). On the other hand, if the NG detector 218 detects a signal at node $V_1$, NG detector 218 may determine whether the detected signal is within acceptable threshold boundaries (block 706). For example, temperature fluctuations may result in oscillation frequency variation of the example virtual inductor 214 that are deemed to be within acceptable limits. Additionally or alternatively, the NG detector 218 may determine if the properties of the signal are within acceptable limits, and trigger the gate driver 220 if not (block 704).

Even if the NG detector 218 detects a signal at node $V_1$ (block 702), and the signal is within acceptable threshold limits (block 706), the LG detector 222 may monitor for a signal after the low pass filter 216 at node $V_2$ (block 708). As described above, the example low pass filter 216 attenuates the oscillation frequency component caused by the parallel combination of $L_1$, $C_1$, $-R_1$, and the inductor $L_2$ (e.g., the virtual inductor 214). In the absence of the oscillation frequency, the LG detector 222 may determine whether a relatively lower frequency is present, such as a frequency at or near the source of a household power line (e.g., 50 Hz, 60 Hz, etc.) (block 710). Without limitation, the example LG detector 222 may determine whether the output signal from the low pass filter 216 is within appropriate thresholds (e.g., magnitude, duration, etc.) (block 710). If not, the LG detector 222 signals the gate driver 220 to trip so that the example GFDC 202 stops providing electrical energy to the load (block 712). However, if the LG detector 222 determines that the signal properties are within the established limits (block 710), then no fault has occurred and the example process 700 continues to monitor nodes $V_1$ and $V_2$ for both NG and LG faults.

Figure 8A:
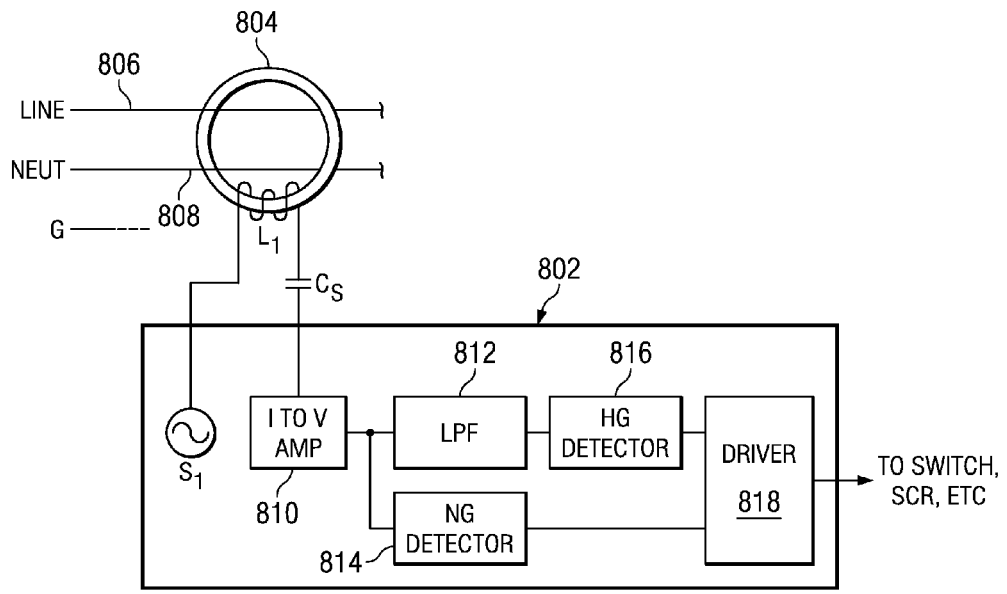
FIG. 8A is a block diagram of another example ground fault detector in which ground faults may be detected with a single sense coil.

FIG. 8A illustrates an additional example GFDC 802 to detect LG and NG faults with one coil rather than two. In the illustrated example of FIG. 8, the GFDC 802 may operate instead of the ground fault detector circuit 116 and corresponding second coil 120 of FIG. 1. The GFDC 802 receives signals from a sense coil 804 having a primary winding through which a line conductor 806 and a neutral conductor 808 pass. Current imbalances between the line conductor 806 and the neutral conductor 808 may be detected by the example sense coil 804 during fault conditions, in which fault conditions include an LG fault and/or an NG fault.

The sense coil 804 includes a secondary winding $L_1$ that is connected to an oscillator $S_1$, and a current-to-voltage amplifier 810 via a saturation capacitor $C_S$ to prevent and/or minimize amplifier saturation during DC conditions. However, the example GFDC 802 of FIG. 8A may employ methods and apparatus to eliminate $C_S$ while preserving saturation prevention functionality, as discussed in further detail below. The example GFDC 802 also includes a low pass filter 812, an NG detector 814, and an LG detector 816. Both the NG detector 814 and the LG detector 816 may provide one or more signals to a driver 818 in the event of a fault. Persons having ordinary skill in the art will appreciate that the driver 818 may include, but is not limited to, an SCR driver, a transistor driver, a relay driver, etc.

Figure 8B:
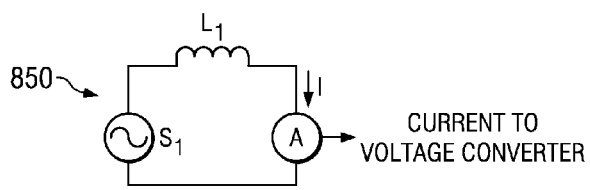
FIGS. 8B-8D are example equivalent circuits for the example ground fault detector of FIG. 8A during a non-fault condition, a neutral-to-ground fault, and a line-to-ground fault, respectively.

If there are no faults (either LG and/or NG), then a corresponding non-fault equivalent circuit 850 results, as shown in FIG. 8B. Generally speaking, based on the secondary winding $L_1$, which is the magnetization inductance of the sense coil 804, and the frequency of the oscillator $S_1$, the current into the current to voltage amplifier 810 may be represented by Equation 4.

$$I = \frac{V_{OSC}}{L_1 * 2\pi f} \quad \text{(Equation 4)}$$

Figure 8C:
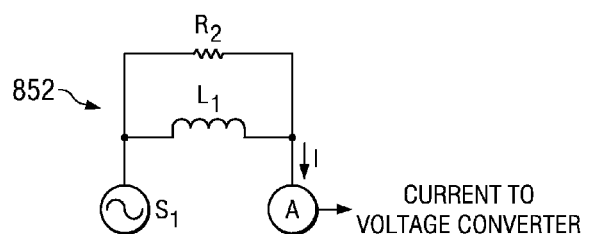

In example Equation 4 above, the value $V_{OSC}$ represents the voltage of oscillator $S_1$, $L_1$ is the magnetization inductance of the sense coil 804, and f is the applied frequency of the oscillator $S_1$. Absent any fault condition, the NG detector 814 may determine that the current is within one or more appropriate thresholds. However, in the event of a NG fault, a corresponding NG fault equivalent circuit 852 results, as shown in FIG. 8C. In the example NG fault equivalent circuit 852 of FIG. 8C, $R_2$ represents an equivalent resistance based on a NG resistance $R_G$ and a number of turns (n) in the sense coil 804, mathematically represented in example Equation 5.

$$R_2 = n^2 * R_G \quad \text{(Equation 5)}$$

As a result, the current detected by the current to voltage amplifier 810 is mathematically represented in example Equation 6.

$$I \approx \frac{V_{OSC}}{R_G} \text{ equation has changed} \quad \text{(Equation 6)}$$

The example NG detector 814 may determine that, as a result of the added resistance $R_G$ in parallel with the inductor L1, the amplitude of the signal increases and one or more thresholds have been exceeded, thereby indicating a fault condition. One or more signals may be sent by the NG detector 814 to the driver 818 to activate one or more safety devices, such as a relay to break the line-conductor 806 and/or neutral conductor 808 from an electrical source.

Figure 8D:
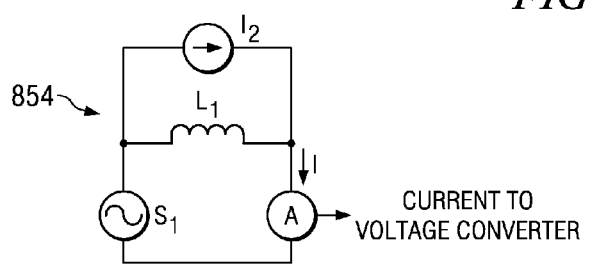

In the event of an LG fault, an LG fault equivalent circuit 854 results, as shown in FIG. 8D. In the example LG fault equivalent circuit 854 of FIG. 8D, $I_2$ represents additional current flow detected as a result of direct contact between the line-conductor 806 and a ground conductor. However, because this current ($I_2$) is an additional imbalance current having a frequency equal to that of the power line source (e.g., a U.S. domestic 60 Hz line-power), the example low pass filter 812 may attenuate the relatively higher oscillation frequency component and reveal the fault line frequency component. The example LG detector 816 may sense this signal (e.g., at 60 Hz) and, in response, send one or more trip signals to the driver 818.

Saturation Capacitor Reduction

Figure 9:
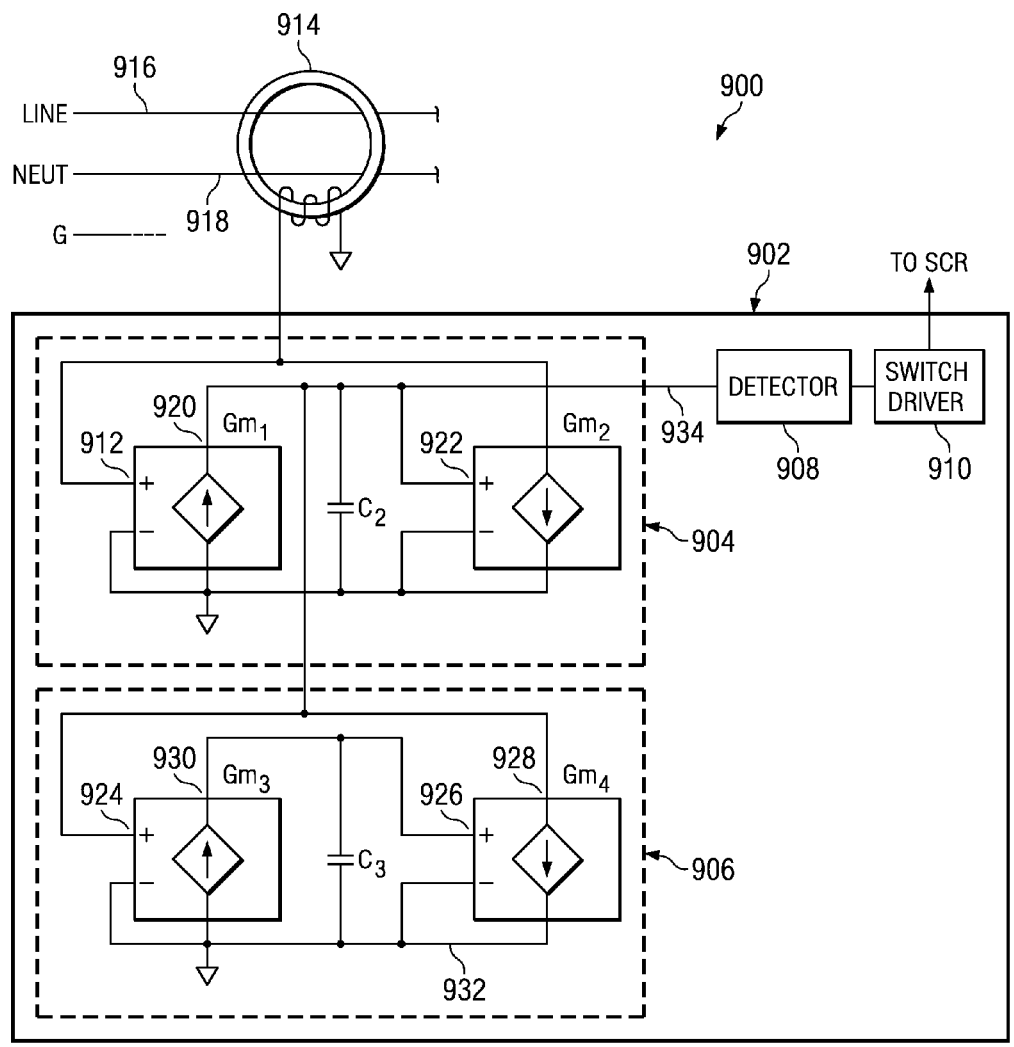
FIG. 9 is a block diagram of an example ground fault detector to detect fault conditions and simulate a saturation capacitor.

As described above in connection with FIG. 1, the saturation capacitor $C_S$ connected to the first sense coil 112 and the second coil 120 allow for detection of current imbalance conditions without causing a saturation of the amplifier during DC input conditions. While the saturation capacitors $C_S$ of FIG. 1 permit AC signals to pass and block the DC signals, the size of such saturation capacitors $C_S$ is directly proportional to the cost of the GFCI 100. FIG. 9 illustrates a portion of a ground fault detector device 900, which includes a ground fault detector circuit (GFDC) 902. The example GFDC 902 may operate instead of, for example, the ground fault detector circuit 116 and saturation capacitor(s) $C_S$ of FIG. 1, and includes a first transconductor architecture sub circuit 904, a second transconductor architecture sub circuit 906, a detector 908, and a switch driver 910 to electrically trigger one or more safety devices (e.g., a mechanical relay to break electrical contact to an electrical source).

The first transconductor architecture sub circuit 904 includes a voltage-to-current converter $G_{M1}$ (having a corresponding transconductance $g_M$) having a positive input 912 to which a sense coil 914 is connected. A line conductor 916 and a neutral conductor 918 pass through the sense coil 914 to monitor for, in part, current imbalances therebetween. However, the sense coil 914 in the illustrated example of FIG. 9 does not include a saturation capacitor that typically accompanies prior art sense coils, thereby allowing for cost reduction.

In operation, the voltage-to-current converter $G_{M1}$ current output node 920 is connected to a positive input node 922 of voltage-to-current converter $G_{M2}$, in which both of the voltage-to-current converters ($G_{M1}$ and $G_{M2}$) are within the first transconductor architecture sub circuit 904. Additionally, the second transconductor architecture sub circuit 906 includes a voltage-to-current converter $G_{M3}$ having a positive input node 924, which is electrically connected to the current output node 920 of $G_{M1}$. Much like the first transconductor architecture sub circuit 904, the second transconductor architecture sub circuit 906 includes a second voltage-to-current converter ($G_{M4}$) having a positive input node 926 and a current input node 928. However, rather than incorporate a saturation capacitor $C_S$, as is shown in FIG. 1, the second transconductor architecture sub circuit 906 of FIG. 9 includes capacitor $C_3$ connected at a current output node 930 of $G_{M3}$ and the positive input node 926 of $G_{M4}$, and a negative rail 932. Capacitor $C_3$ is smaller than capacitive values typically required for saturation purposes and is, thus, more cost effective when incorporated within the transconductor architecture sub circuit 906.

Each of the voltage-to-current converters $G_{M1}$, $G_{M2}$, $G_{M3}$, and $G_{M4}$ have corresponding transconductance values of $g_{M1}$, $g_{M2}$, $g_{M3}$, and $g_{M4}$. The effect of the first and second transconductor architecture sub circuits 904 and 906 results in an equivalent saturation capacitance value as shown by Equation 7. Therefore, $C_3$ may be much smaller than $C_S$.

$$C_S = \frac{C_3 g_{M1} g_{M2}}{g_{M3} g_{M4}} \quad \text{(Equation 7)}$$

The first and second transconductor architecture sub circuits 904 and 906 in conjunction with $C_3$, prevent output saturation of the voltage-to-current converters, and the signal at node 934 that contains the information of the current is fed to the detector 908. Without limitation, the example detector 908 of FIG. 9 may include the GFDC 802 of FIG. 8A or the example GFDC 202 of FIG. 2.

Automatic GFCI Testing

As described above in connection with FIG. 1, prior art GFCIs 100 include a test switch 124 and a fault resistor $R_F$ that allow current from the line conductor 102 to bypass a return path through the sense coil 112. As a result, the sense coil 112 will sense the incoming current from the line conductor 102, but not any returning current through the neutral conductor 104, thereby causing a current signal to be induced on the sense coil 112. Such a current imbalance signal, when detected by the ground fault detector circuit 116, causes the silicon controlled rectifier (SCR) 118 to turn on, which energizes a relay coil in the solenoid relay contact 110. The energized relay coil in the solenoid relay contact 110 breaks electrical contact from the source energy supplied by the line conductor 102 and the neutral conductor 104, thereby preventing and/or minimizing the potential for an electric shock.

While the test switch 124 allows the GFCI 100 to be operationally tested by simulating a fault condition, such verification of proper GFCI functionality and/or capabilities is dependent upon regular testing by the end user. In the event the end user fails to test the prior art GFCI 100 on a periodic and/or regular basis, one or more fault conditions may arise in between tests. Furthermore, if the GFCI 100 fails to operate correctly due to, for example, a failed sense coil, a failed saturation capacitor $C_S$, etc., then the end user will not be protected in case a fault occurs. In such circumstances, merely having a GFCI present may provide a false sense of security to the end user.

Figure 10:
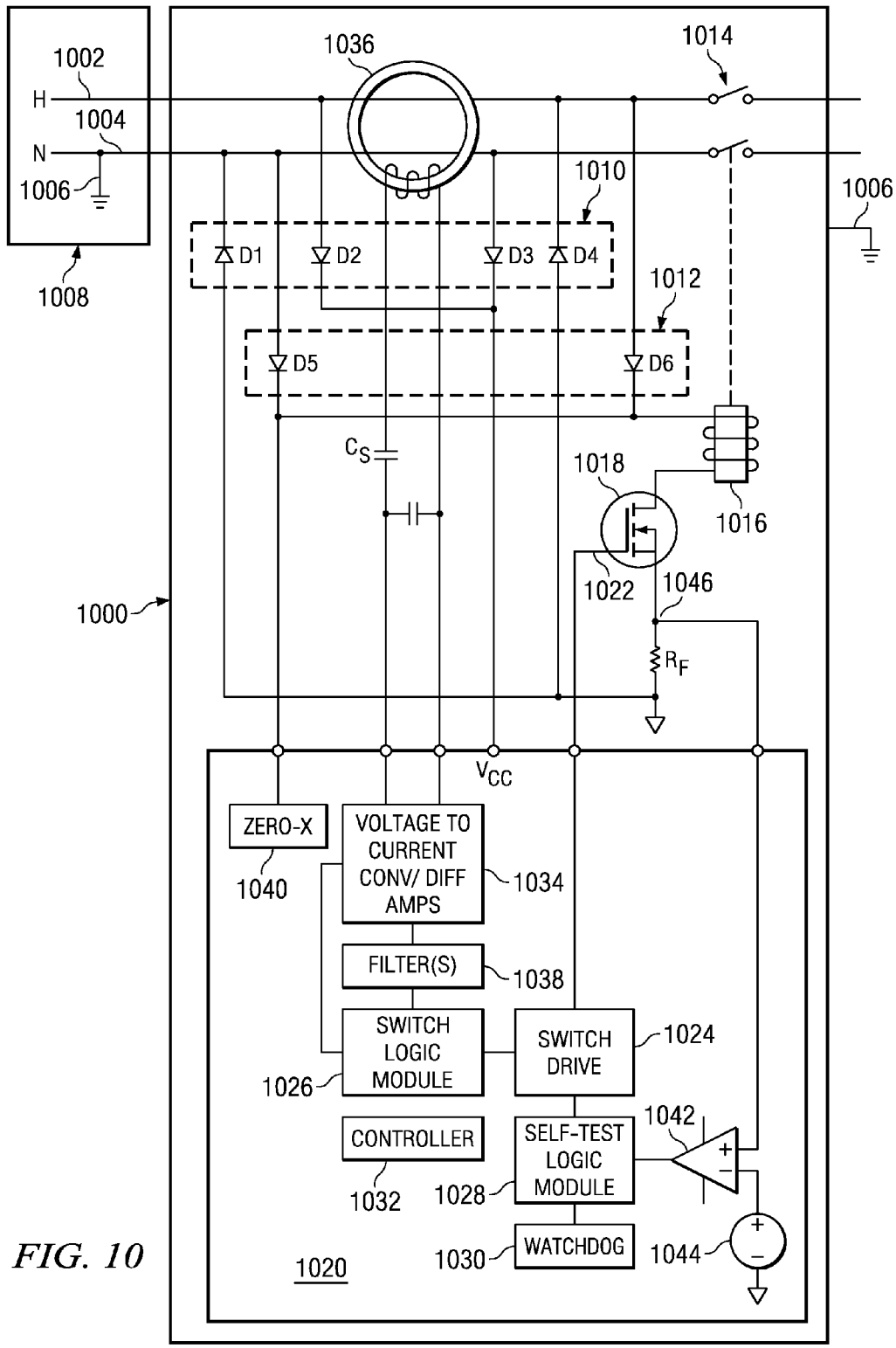
FIG. 10 is a block diagram of an example ground fault detector to perform an automatic self-test.

FIG. 10 illustrates an example ground fault detector device 1000 electrically connected to a hot (line) conductor 1002 and a neutral conductor 1004. An electrical and/or earth ground 1006 may be located at an electrical source 1008, such as at an electrical panel located within an end user's household. Persons having ordinary skill in the art will appreciate that the ground 1006 at the electrical source 1008 is typically connected to the neutral conductor 1004. However, the ground 1006 from the electrical source 1008 is typically distributed throughout the household with no other intentional contact with either the neutral conductor 1004 and/or the hot conductor 1002. In other words, any contact between ground 1006 and the neutral conductor 1004 in a location other than the source 1008 is referred to as a neutral to ground fault.

The example ground fault detector device 1000 includes a power diode bank 1010, a fault diode bank 1012, a relay 1014 to break electrical power with the source 1008 in the event of a fault, and a relay coil 1016 that, when energized, causes the relay coil 1016 to open. A switch 1018 is electrically connected to the relay coil 1016, which may be implemented as an SCR or a transistor (e.g., a metal oxide semiconductor field effect transistor (MOSFET)). The switch 1018 receives one or more signals from a ground fault detector circuit (GFDC) 1020 based on, for example, fault condition information and/or self-test request(s). In the illustrated example of FIG. 10, the switch 1018 is implemented as a MOSFET and receives one or more control signals from the GFDC 1020 via a gate pin 1022. As described in further detail below, because a MOSFET may be driven to create one or more channel sizes, the MOSFET may enable one or more levels of conduction of the relay coil 1016. In other words, the example MOSFET 1018 of FIG. 10 may have a full-on state, in which the relay coil opens, or one or more partially-on states, in which current may flow through the relay coil 1016 without opening the relay 1014 to break electrical power with the source 1008.

Additionally or alternatively, the MOSFET 1018 and/or other switch may be implemented within the example ground fault detector device 1000 independently of the relay coil 1016.

The example GFDC 1020 of FIG. 10 includes a switch driver 1024 that, when signaled by a switch logic module 1026 and/or a self-test logic module 1028, elicits a signal to the gate pin 1022. A watchdog timer 1030 is operatively connected to the self-test logic module 1028 to prevent a runaway test condition. Persons having ordinary skill in the art will appreciate that the watchdog timer 1030 may, additionally or alternatively, be embodied in a controller 1032. One or more voltage-to-current converters and/or one or more differential amplifiers 1034 may receive one or more signals from a sense coil 1036. While the example ground fault detector device 1000 illustrates a saturation capacitor $C_S$ connected to the sense coil 1036, the example first and second transconductor architecture sub-circuits (904 and 906) may be employed to eliminate $C_S$ and, instead, use a smaller capacitor. The differential amplifiers 1034 may employ the GFDC 202 of FIG. 2, the GFDC 802 of FIG. 8A, and/or include the first and second transconductor architecture sub circuits 904 and 906 of FIG. 9. The output of the example differential amplifiers 1034 may be applied to one or more filters 1038 and/or the gate logic module 1026 to determine one or more control function(s) (e.g., turn MOSFET 1018 partially-on for self test, turn MOSFET 1018 completely on due to a fault, turn MOSFET 1018 off, etc.).

Without limitation, the example GFDC 1020 may include one or more additional or alternative modules for other purposes, such as an example zero-cross module 1040. For example, in the event that the switch 1018 is employed as an SCR, then the zero-cross module 1040 may signal the controller 1032 when the voltage phase of the source waveform is at a zero-cross point. Such information may be useful to determine when to turn-on the SCR, or such information may be useful to count how many source power cycles elapse during a suspected fault condition. If more than three power cycles elapse (i.e., 6 zero-cross detections) while, for example, the sense coil 1036 exhibits a current imbalance, then the controller 1032 may signal the switch driver 1024 to energize the switch 1018 via the gate pin 1022.

In operation, the example power diode bank 1010 provides power to the GFDC 1020 via four diodes $D_1$, $D_2$, $D_3$, and $D_4$. The four diodes form a full wave bridge to supply a positive voltage to the GFDC 1020 so that when current flows into diodes $D_1$ and $D_2$ (e.g., during a positive power cycle), no current flows at the hot conductor 1002 and the neutral conductor 1004 passing through the sense coil 1036, thereby preventing any current imbalance that may cause a fault trip. Diode pairs $D_1$ and $D_2$ may form a power tap for one half-phase of a power-line cycle (e.g., a positive ½ phase of a 60 Hz domestic household), and diode pairs $D_3$ and $D_4$ may form another power tap for the second half-phase of the power-line cycle. As shown in FIG. 10, the first power tap (i.e., diode pair of $D_1$ and $D_2$) is at a location prior to the sense coil 1036. Additionally, the second power tap (i.e., diode pair $D_3$ and $D_4$) is at a location after the example sense coil 1036. When current flows into diodes $D_3$ and $D_4$ (e.g., during a negative power cycle), the current passing through the coil on the hot conductor 1002 and the neutral conductor 1004 are the same, thereby preventing the sense coil 1036 from detecting any current imbalance. Although the illustrated example of FIG. 10 illustrates diodes D1, D3, and D5 connected to the neutral conductor 1006, and diodes D2, D4, and D6 connected to the line conductor 1002, such orientation is not limited thereto. For example, the first power tap (e.g., diodes D1 and D2) may be connected to the line conductor 1002 and the line conductor 1004, respectively, while the second power tap (e.g., diodes D3 and D4) may be connected to the line conductor 1002 and the and the neutral conductor 1004, respectively. Additionally, while the illustrated example of FIG. 10 includes full-wave capabilities, the example switch 1018 may also operate to perform self test and signal the relay 1014 during half-wave operation.

At scheduled and/or periodic times, the example self-test logic module 1028 is invoked (e.g., invoked by the controller 1032) to partially turn-on the MOSFET 1018 via the switch driver 1024 (e.g., a MOSFET gate driver) and the gate pin 1022. As a result, diodes $D_5$ and $D_6$ of the fault diode bank 1012 may conduct during alternate power phases. Diode $D_5$ establishes a first fault tap as a fault diode at a first location prior to the sense coil 1036, and diode $D_6$ establishes a second fault tap as a fault diode at a second location after the sense coil 1036. For example, during a positive power cycle, $D_6$ conducts and current flows from the hot conductor 1002 after passing through the sense coil 1036 as a current source path. The current continues to flow through the relay coil 1016, but because the switch driver 1024 is not fully turned-on, insufficient current passes through the relay coil 1016 to cause the relay 1014 to open. The current continues to flow through the MOSFET 1018 and a fault resistor $R_F$ to ground and through $D_1$ to the neutral conductor 1004 as a current bypass path. However, because the current returning to the neutral conductor is located at a point preceding (i.e., the first power tap) the sense coil 1036, a fault is detected. Rather than trip the relay coil 1016, the controller 1032 and/or the gate logic module 1026 may associate the fault with the active test conditions so that the relay coil is not opened unnecessarily.

Similarly, during a negative power cycle, $D_5$ conducts and current flows from the neutral conductor 1004 before passing through the sense coil 1036 as a current source path. The current flows through the relay coil 1016 and, because the switch driver 1024 is not fully turned-on, insufficient current passes through the relay coil 1016 to cause the relay 1014 to open. The negative power cycle current continues to flow through the MOSFET 1018 and the fault resistor $R_F$ to ground and through $D_4$ to the line conductor 1002 as a current bypass path. In view of the fact that the current returning to the line conductor 1002 is located at a point after (i.e., a second power tap) the sense coil 1036, a fault is detected. As described above, the relay coil 1016 is not tripped despite sensing this fault because the controller 1032 and/or the gate logic module 1026 expects the fault during the duration of the self-test.

Additionally or alternatively, the example GFDC 1020 may include an operational amplifier (OPAMP) or comparator 1042 to compare a potential of the MOSFET 1018 output against a predetermined setpoint 1044. An output of the OPAMP 1042 may allow the self-test logic module 1028 to adjust how hard or how softly the switch driver 1024 drives (conducts) the MOSFET 1018. As a result, one or more test patterns may be applied to the MOSFET 1018 (or any other type of switch) to, for example, evaluate both real and imaginary components of the switch impedance without unnecessarily engaging the relay coil 1016. Additionally, driving the MOSFET 1018 at one or more alternate levels of conduction may allow regulation and testing of the electro-mechanical integrity of the relay coil 1016 (e.g., to determine whether the relay coil 1016 opens and/or closes within acceptable electrical specifications, temperature specifications, noise conditions, time-to-close, etc.). Without limitation, one or more switch 1018 tests may include a short circuit test, an inductance test, and/or a response-time test.

Figure 11:
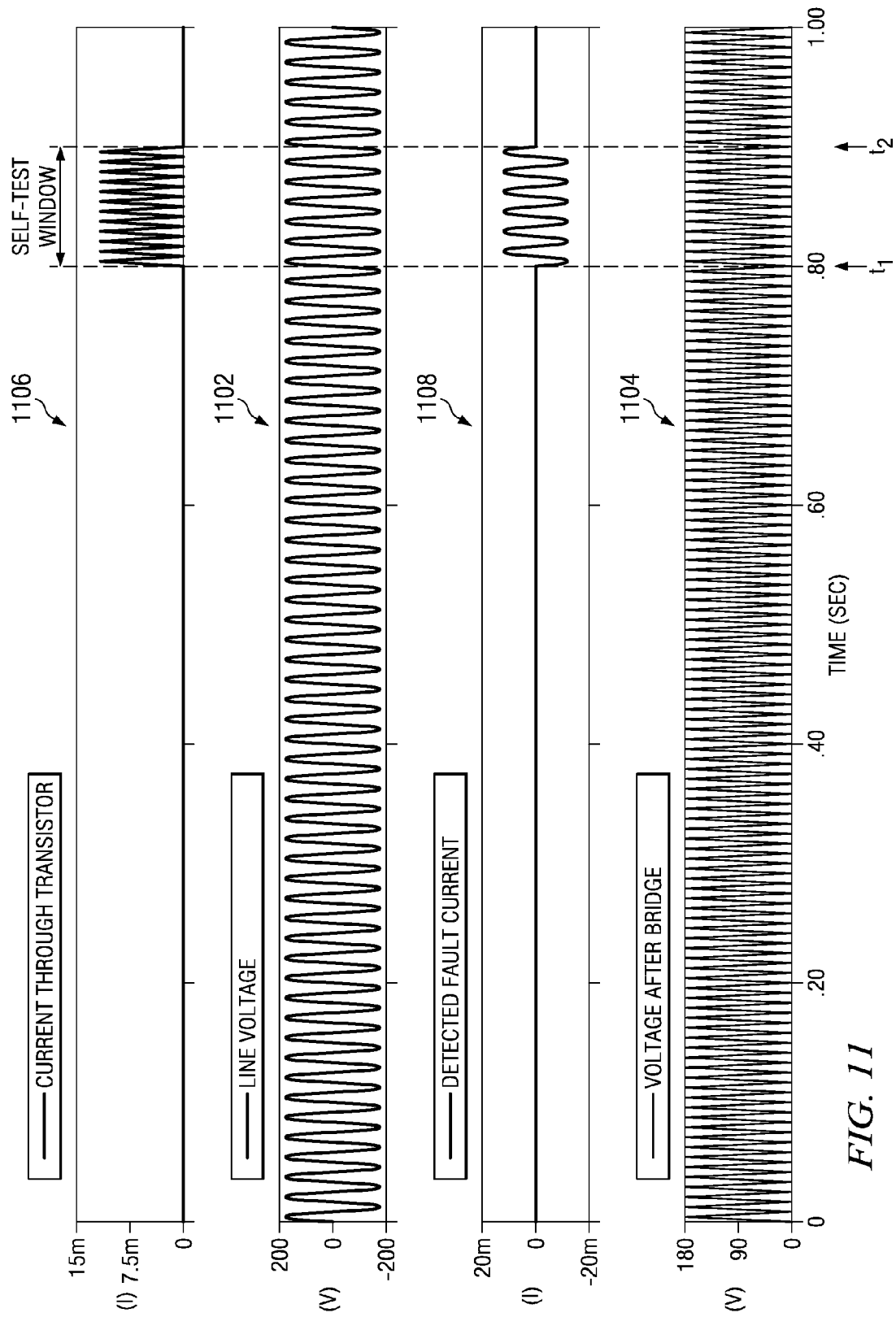
FIG. 11 includes example output plots for the example ground fault detector of FIG. 10 during self-test conditions.

FIG. 11 illustrates example waveforms for the ground fault detector device 1000 shown in FIG. 10. In the illustrated example of FIG. 11, a line voltage waveform 1102 indicates phases of the power cycles exited by the source 1008, and a post-bridge waveform 1104 indicates corresponding phases of the power cycles after the power diode bank 1010 (i.e., diodes $D_1$, $D_2$, $D_3$, and $D_4$). At time $t_1$, the example self-test logic module 1028 or the controller 1032 partially turns-on the switch 1018 (e.g., a MOSFET, a bipolar junction transistor, etc.), and a transistor current waveform 1106 indicates the current conducted as a result of switch 1018 activation. As described above, because switch 1018 activation allows the diodes in the fault diode bank 1012 to conduct, a full wave fault is simulated with the same signal properties as a real fault. The full wave fault is detected by the sense coil 1036, as shown by a detected fault current waveform 1108. The example ground fault detector device 1000 may perform the test for a predetermined number of power cycles, as determined by, for example, the zero-cross module 1040. However, the self-test may stop at time $t_2$ based on, but not limited to, a timer expiration in the example controller 1032, the watchdog 1030, and/or the example self-test logic module 1028.

FIG. 12 illustrates a flowchart representative of an example process 1200 that may be executed to implement the example ground fault detector device 1000 and corresponding self-test of FIG. 10. The example process 1200 of FIG. 12 begins with, for example, the controller 1032 and/or the self-test logic module 1028 initiating a self-test (block 1202). Persons having ordinary skill in the art will appreciate that the controller 1032 may include an on-board timer and/or logic that employs one or more registers to determine a time-base. For example, the controller may monitor the zero-cross module 1040 for a predetermined number of power line cycles before initiating the self test.

If the example ground fault detector device 1000 is not executing a self-test (block 1202), then the voltage-to-current converter 1034 monitors the sense coil 1036 for a current imbalance (block 1204). If no current imbalance is detected by the voltage-to-current converter 1034, then the example GFDC 1020 continues to monitor for fault conditions or initiates a self-test mode (block 1202). However, if a current imbalance is detected (block 1204), then the switch logic module 1026 and/or the filters 1038 determine if one or more thresholds are exceeded (block 1206). For example, power line transients may occur periodically and/or intermittently that result in some current and/or frequency fluctuations detected by the sense coil 1036. As a result of some expected fluctuation (s), the filters 1038 and/or gate logic module 1026 may employ one or more thresholds so that the relay 1014 is not tripped into an open state unnecessarily.

If the one or more signal properties (e.g., an amplitude, a duration, a number of cycles, a frequency, etc.) are not exceeded, then the example process 1200 returns to block 1202 to continue monitoring for fault conditions and self-test mode. In the event that the signal properties are outside one or more limits (e.g., outside one or more threshold(s) of the one or more signal properties) such as, for example, a detected current value exceeding 0.01 mA for more than three power cycles, then the switch logic module 1026 provides a signal to the switch driver 1024 to energize the switch 1018 (block 1208). Thresholds may also include, but are not limited to, a current level that, when detected, cause the relay coil 1014 to open regardless of how many power line cycles elapse during the detected current level.

If a self test mode initiation is invoked by, for example, a predetermined number of zero-cross cycles or an expiration of a timer on the controller 1032 and/or the self-test logic module 1028 (block 1202), then the self-test logic module 1028 provides a signal to the switch driver 1024 to partially turn on the switch 1018 (block 1210). As a result, the switch allows current to flow through the fault diode bank 1012 (i.e., diodes $D_5$ and $D_6$) and the relay coil 1016. As described above, the self-test logic module 1028 may regulate how much the switch 1018 conducts so that current may flow through the relay coil 1016 without opening the relay 1014. Assuming, for example, that diode $D_6$ conducts during the positive ½ power cycle, current flowing through the switch 1018 causes a voltage drop across $R_F$, which continues to the neutral conductor 1004 via $D_1$. The current that conducted through $D_6$ from the hot conductor 1002 passed through the sense coil 1036, however the return current path to the neutral conductor 1004 via $D_1$ bypassed the sense coil 1036, thereby resulting in a simulated fault. If the example ground fault detector device 1000 and/or the GFDC 1020 is working properly, the voltage-to-current converter 1034 will detect this imbalance as a fault (block 1212). To prevent unnecessarily opening the relay 1014 during self-test, the controller 1032 and/or the self-test logic module 1028 may disable the gate drive 1024 when a known self test is executing. However, if the self test is executing and no current fluctuation is detected, then the controller 1032 and/or the self-test logic module 1028 causes the switch 1018 to fully energize so that the relay 1014 opens (block 1208).

A self test initiated by the controller 1032 and/or the self-test logic module 1028 may be limited in duration to minimize instances where the example ground fault detector device 1000 may not be protecting against an actual fault. For example, the controller 1032 and/or the self-test logic module 1028 may employ the zero-cross detector 1040 to monitor for a predetermined number of power line cycles for which the self-test executes. Upon expiration of the predetermined number of power line cycles, the self-test stops executing and fault detection resumes. In the event that an actual fault occurs at a moment that overlaps with the self-test, then actual exposure to potential shock hazard(s) may be minimized and/or avoided by minimizing the duration of the self-test. In other words, if the self test includes a power line threshold limitation of three power cycles, then an end user of the example ground fault detector device 1000 will not be exposed to potential shock conditions for more than approximately 50 milliseconds. Persons having ordinary skill in the art will appreciate that the threshold number of power line cycles and/or a threshold time limit may be set and/or adjusted according to other factors including, but not limited to, regulation(s) imposed by Underwriters Laboratories.

The example GFDC 1020 may also determine whether a fault signal was detected by the OPAMP 1042 (block 1214). Failure to sense a fault signal within one or more thresholds established by the setpoint 1044 (block 1216) may be indicative of one or more circuit failures at one or more components of the example ground fault detector device 1000. As a result of not detecting, for example, a voltage at a MOSFET source 1046 during a known self test, the controller 1032 and/or the self-test logic module 1028 may cause the switch to fully energize, thereby causing the relay 1014 to open (block 1208) and/or display a warning/failure light to alert the user. On the other hand, if the OPAMP 1042 detects the fault signal within the established setpoint(s) 1044, the test is deemed a pass (block 1218) and the process 1200 returns to block 1202.

Continuous GFCI Testing

Figure 13:
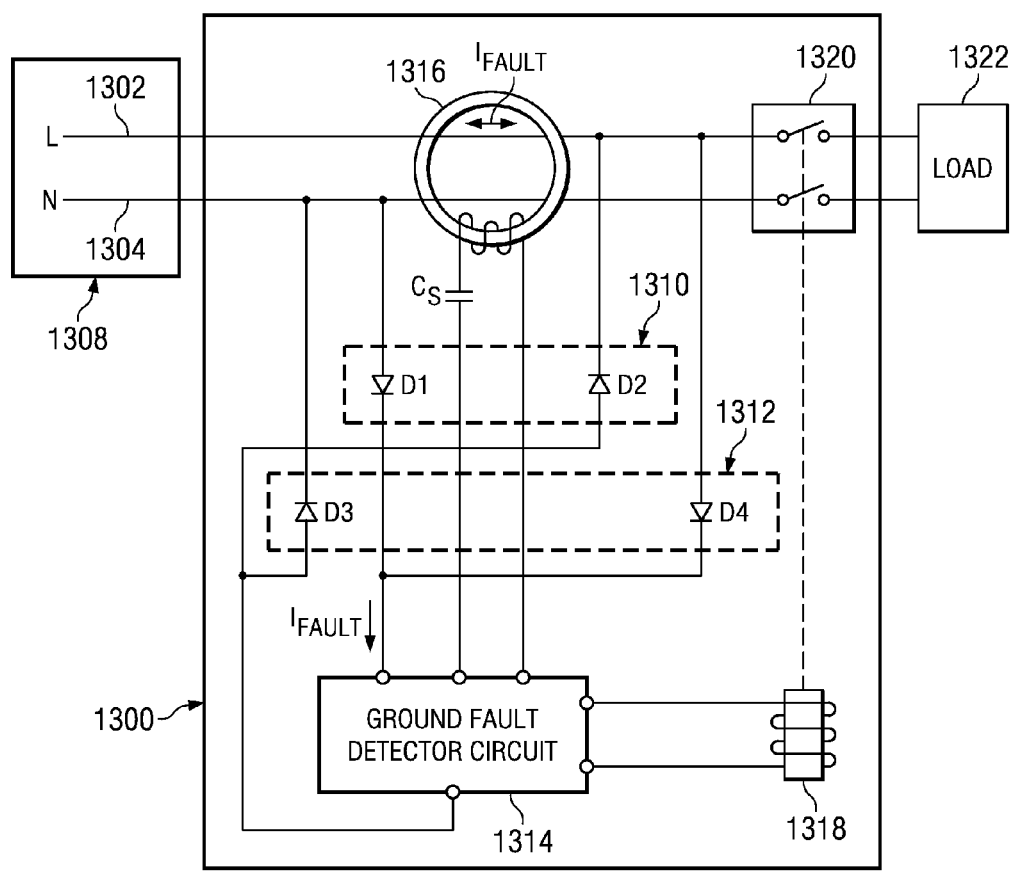
FIG. 13 is a block diagram of an example ground fault detector to perform a substantially continuous self-test.

FIG. 13 illustrates an example ground fault detector device 1300 electrically connected to a hot (line conductor) 1302 and a neutral conductor 1304 from an electrical source 1308. The example ground fault detector device 1300 includes a first power diode bank 1310 having diodes $D_1$ and $D_2$, and a second power diode bank 1312 having diodes $D_3$ and $D_4$. Each of the first and second power diode banks 1310 and 1312 provide power to a GFDC 1314, in which the first power diode bank 1310 supplies power to the GFDC 1314 during a negative power cycle, and the second power diode bank supplies power to the GFDC 1314 during a positive power cycle. In other words, each of the first power diode bank 1310 and the second power diode bank 1312 form a power tap such that the current imbalance is induced for both the positive and negative power-line cycles, thereby simulating a fault. Current imbalance conditions may be detected by a sense coil 1316 that, when present and associated with a fault condition as determined by the GFDC 1314, cause a relay coil 1318 to be energized and a power line relay 1320 to open. When the power line relay 1320 is open, electrical energy supplied by the electrical source 1308 does not reach a load 1322, thereby protecting the user from potential shock hazards.

In the illustrated example of FIG. 13, the ground fault detector device 1300 is performing a self-test continuously. The continuous self-test is particularly beneficial due to, in part, the continuous nature of verification that the ground fault detector device 1300 is working properly, thereby minimizing shock hazards to end users. In other words, because one or more failures may occur in-between manual, scheduled, and/or periodic self-test operations of other ground fault detector devices, there exists a possibility of a shock hazard to an end user before a subsequent self-test may operate. Additionally, the continuous self-test of the example ground fault detector device 1300 of FIG. 13 is relatively fast, such that it may detect one or more fault conditions during each half power-line cycle (e.g., every 8 milliseconds in U.S. domestic households).

To illustrate, during a positive power cycle diode $D_4$ conducts to provide power to the GFDC 1314. By virtue of diode $D_4$ being located after the sense coil 1316, the current drawn by the GFDC 1314 is sensed by the sense coil 1316, but the return-path current through diode $D_3$ does not pass through the sense coil 1316. As a result, the sense coil 1316 detects a current imbalance ($I_{FAULT}$) that is equal to the amount of current drawn by the GFDC 1314. Additionally, $I_{FAULT}$ is in sinusoidal phase with the power-line cycle (as a real fault would be), and because that current is in phase with the line voltage, zero crossing information may be utilized for switch triggering (e.g., SCR), if needed. The current drawn by the GFDC 1314, and detected by the sense coil 1316 may be indicative of a quiescent current. In other words, even when the GFDC 1314 is not actively energizing the relay coil 1318 during a fault, one or more components (e.g., operational amplifiers, filters, voltage-to-current converters, transistors, diodes, a purposely implanted load, etc.) draw some current. Similarly, during the negative power cycle, diodes $D_1$ and $D_2$ conduct in a similar manner to supply the example GFDC 1314 with power. Despite the continuous detection of $I_{FAULT}$, the example GFDC 1314 does not cause the power line relay 1320 to open unless actual (real) fault conditions are also detected, as discussed in further detail below.

Continuous detection of $I_{FAULT}$ may indicate proper operation of the example ground fault detector device 1300 if the value of $I_{FAULT}$ is equal to an expected current draw of the GFDC 1314. In particular, continuous detection of a known $I_{FAULT}$ magnitude indicates that the sense coil 1316 and/or the GFDC 1314 is working properly, thereby providing the user with protection against fault conditions. However, in the event of a fault condition (i.e., a real fault caused by an NG fault and/or an LG fault), such as a current imbalance detected by the sense coil 1316 in excess of a value associated with current draw of the example GFDC 1314, the power line relay 1320 will trip to protect the user from the detected fault condition. FIG. 14A illustrates an example fault separation circuit 1400 within the GFDC 1314 to determine when $I_{FAULT}$ is related to the continuous self test condition, or when $I_{FAULT}$ is related to an actual fault condition. The sense coil 1316 output value 1402 is separated and provided to a self-test detector 1404 and a subtractor 1406. The subtractor subtracts the known fault signal from the output value 1402 of the sense coil 1316 and provides the subtracted signal to a normal-fault detector 1408 (e.g., a comparator).

In operation, the self-test detector 1404 determines whether the output value 1402 of the sense coil 1316 includes the expected quiescent current of the GFDC 1314. Such expected quiescent current may be provided to the self-test detector 1404 via a threshold 1410. If the output value 1402 fails to exceed the threshold 1410, then the self-test detector 1404 indicates a fault condition to cause the power line relay 1320 to open. However, if the threshold 1410 value is at least met or exceeded, the self-test detector 1404 does not send a fault signal to cause the power line relay 1320 to open. Additionally, the normal-fault detector 1408 determines whether the output value 1402 includes any current imbalance that exceeds the expected quiescent current of the GFDC 1314. In the event that the output value 1402, after the expected quiescent current signal is subtracted by the subtractor 1406, includes a value in excess of the threshold 1410, then the normal-fault detector 1408 provides a fault condition signal to cause the power line relay 1320 to open.

Self test verification and fault detection may also be employed by way of the example fault separation circuit 1450 shown in FIG. 14B, which may be realized within the example GFDC 1314. In the illustrated example of FIG. 14B, the sense coil 1316 output value 1452 is provided to a self-test detector 1454 (e.g., a magnitude comparator) and a normal-fault detector 1458 (e.g., a magnitude comparator). In operation, the example self-test detector 1454 compares the output value 1452 with a first threshold 1460. The first threshold 1460 may be set to a value that, when exceeded by the output value 1452, is indicative of an expected $I_{FAULT}$ value associated with the quiescent current of the GFDC 1314. In other words, when the output value 1452 exceeds the first threshold 1460, no error signal is provided by the self-test detector 1454 to open the power line relay 1320. On the other hand, if the output value 1452 fails to exceed the first threshold 1460, then the self-test detector 1454 provides an error signal to indicate that self test has failed, thereby opening the power line relay 1320.

In the event that the self-test detector 1454 determines that the output value 1452 exceeds the first threshold 1460, a fault may still exist. To determine whether a fault exists when the output value 1452 exceeds the first threshold 1460, the normal-fault detector 1458 compares the output value 1452 against a second threshold 1462. The output value 1452 is a sum of both the self-test current imbalance and a real fault current imbalance, both of which are in-phase. As the two currents are in-phase, any real fault detected will result in an output value magnitude increase, which may be compared against the second threshold 1462. For example, if the signal magnitude is between the threshold 1460 and 1462, the operation is safe because the simulated fault is detected, but the magnitude is not high enough to indicate that a real fault is present. An error signal is provided by the example normal-fault detector 1458 if the output value 1452 exceeds the second threshold 1462, thereby causing the power line relay 1320 to open.

FIG. 15 illustrates a flowchart representative of an example process 1500 that may be executed to implement the example ground fault detector device 1300, and the example circuits 1400, and 1450 of FIGS. 13, 14A, and 14B, respectively. The example process 1500 of FIG. 15 begins with, for example, receipt of one or more current imbalance signal(s) from the sense coil 1316 of the ground fault detector device 1300 (block 1502). As described above, because of the diode arrangement for the first power diode bank 1310 and the second power diode bank 1312, fault current(s) ($I_{FAULT}$) detected by the sense coil 1316 associated with either the quiescent current or a real fault will always be in-phase. The received current signal ($I_{FAULT}$) represents a signal that may include only the quiescent current of the example GFDC 1314, a signal that may include both the quiescent current and a real fault current, or a signal that may include neither the quiescent current nor a real fault current.

In the illustrated example process 1500, the received current signal ($I_{FAULT}$) is compared with a threshold value associated with an expected quiescent current (block 1504). As described above, the self-test detector 1404 of FIG. 14A or the self-test detector 1454 of FIG. 14B may compare the received output value 1402 or 1452 with a threshold 1410 or 1460. If the received output value 1402 or 1452 exceeds the threshold 1410 or 1460, then the self test is operating properly, and no error signal is provided by the self-test detector(s) 1404 or 1454. On the other hand, an absence of the quiescent current is deemed a failure of the self test, which results in an error signal sent by the self-test detector(s) 1404 or 1454 to open the power line relay 1320 and/or signal switch logic (block 1506). However, despite a determination that there is no error signal by virtue of detecting at least a minimum current imbalance related to the quiescent current of the example GFDC 1314, it is possible that a real fault exists.

To determine whether a real fault exists, the received output value 1402 may be provided to the subtractor 1406, as shown in FIG. 14A. The example subtractor 1406 subtracts the expected quiescent current signal from the received output value 1402 and provides the result to the normal-fault detector 1408. If the normal-fault detector 1408 determines that the result is less than the applied threshold 1410, then no fault has occurred and no error signal is transmitted by the normal-fault detector 1408 (block 1508). However, if the normal-fault detector 1408 determines that the result is more than the applied threshold 1410, then a fault has occurred because the detected current imbalance exceeds that of the expected quiescent current drain of the GFDC 1314 (block 1508) plus the minimum fault current. To that end, the normal-fault detector 1408 provides an error signal to open the power line relay 1320 (block 1506).

Determining that a real fault exists may also be achieved by way of the example normal-fault detector 1458 of FIG. 14B. The received output value 1452 is compared against the second threshold 1462 (block 1508). If the received output value 1452 exceeds the second threshold 1462, then a fault is deemed true (block 1508) and an error signal is sent by the normal-fault detector 1458 to open the power line relay 1320 (block 1506).

Although certain example methods, apparatus, and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of detecting a ground fault comprising:
driving a first capacitor with an inductor to generate a resonance signal component;
monitoring a virtual inductor signal to determine at least one of a neutral-to-ground fault, a line-to-ground fault, or a non-fault condition, the virtual inductor comprising a voltage-to-current converter and a capacitor; and
generating a fault signal when at least one of the line-to-ground fault or the neutral-to-ground fault is detected.

2. A method as defined in claim 1, wherein monitoring the inductor signal further comprises detecting at least one of an absence or an attenuation of the resonance signal component, the at least one of the absence or the attenuation of the resonance signal component indicative of the neutral-to-ground fault.

3. A method as defined in claim 1, wherein monitoring the inductor signal further comprises:
comparing the resonance signal component to a threshold; and
activating at least one of a switch or an indicator when the oscillation signal component is below the threshold.

4. A method as defined in claim 1, wherein monitoring the inductor signal comprises filtering the resonance signal component to detect the line-to-ground fault.

5. A method as defined in claim 4, further comprising determining whether the filtered resonance signal component comprises a power line frequency signal.

6. A method as defined in claim 5, further comprising generating the fault signal when the power line frequency signal is detected, the power line frequency signal indicative of the line-to-ground fault.

7. A method as defined in claim 1, wherein the voltage-to-current converter comprises an operational amplifier.

8. An article of manufacture storing machine accessible instructions which, when executed, cause a machine to:
drive a first capacitor with a virtual inductor, the virtual inductor comprising a voltage-to-current converter and a capacitor, to generate a resonance signal component;
monitor the virtual inductor signal to determine at least one of a neutral-to-ground fault, a line-to-ground fault, or a non-fault condition; and
generate a fault signal when at least one of the line-to-ground fault or the neutral-to-ground fault is detected.

9. An article of manufacture as defined in claim 8, wherein the machine accessible instructions, when executed, cause the machine to detect at least one of an absence or an attenuation of the resonance signal component, the at least one of the absence or the attenuation of the resonance signal component indicative of the neutral-to-ground fault.

10. An article of manufacture as defined in claim 8, wherein the machine accessible instructions, when executed, cause the machine to:
compare the resonance signal component to a threshold; and
activate at least one of a switch or an indicator when the resonance signal component is below the threshold.

11. An article of manufacture as defined in claim 8, wherein the machine accessible instructions, when executed, cause the machine to filter the resonance signal component to detect the line-to-ground fault.

12. An article of manufacture as defined in claim 11, wherein the machine accessible instructions, when executed, cause the machine to determine whether the filtered resonance signal component comprises a power line frequency signal.

13. An article of manufacture as defined in claim 12, wherein the machine accessible instructions, when executed, cause the machine to generate the fault signal when the power line frequency signal is detected, the power-line signal indicative of the line-to-ground fault.

14. An article of manufacture as defined in claim 8, wherein, the voltage-to-current converter comprising an operational amplifier and a capacitor.

* * * * *